(12) United States Patent
Tanaka

(10) Patent No.: US 7,113,214 B2
(45) Date of Patent: Sep. 26, 2006

(54) SOLID STATE IMAGING APPARATUS

(75) Inventor: Nagataka Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 778 days.

(21) Appl. No.: 10/317,131

(22) Filed: Dec. 12, 2002

(65) Prior Publication Data

US 2003/0112352 A1   Jun. 19, 2003

(30) Foreign Application Priority Data

Dec. 14, 2001   (JP)   ............................. 2001-381910

(51) Int. Cl.
*H04N 5/335* (2006.01)
(52) U.S. Cl. ................. 348/308; 348/230.1; 250/208.1
(58) Field of Classification Search ...................... None
See application file for complete search history.

(56) References Cited

U.S. PATENT DOCUMENTS 6,091,449 A    7/2000  Matsunaga et al.
6,130,713 A *  10/2000 Merrill ......................... 348/308
6,184,055 B1 * 2/2001  Yang et al. ..................... 438/57
6,281,533 B1   8/2001  Miyagawa et al.

FOREIGN PATENT DOCUMENTS

| JP | 11-261046 | 9/1999 |
|----|-----------|--------|
| JP | 11-284166 | 10/1999 |
| JP | 2000-12820 | 1/2000 |
| JP | 2000-13687 | 1/2000 |
| JP | 2000-209508 | 7/2000 |

\* cited by examiner

*Primary Examiner*—Ngoc-Yen Vu
*Assistant Examiner*—Dillon Durnford-Geszvain
(74) *Attorney, Agent, or Firm*—Oblon, Spivak, McClelland, Maier & Neustadt, P.C.

(57) ABSTRACT

A solid state imaging apparatus having a plurality of unit pixels, each pixel including a photodiode and a first readout transistor connected to the photodiode, a monitor including a monitor resistor, configured to measure a depletion potential of the monitor resistor, and a readout voltage generator configured to generate a readout voltage to be applied to a first control electrode of the first readout transistor based on the depletion potential. The monitor resistor has the same impurity concentration distribution as that of the photodiode.

20 Claims, 14 Drawing Sheets

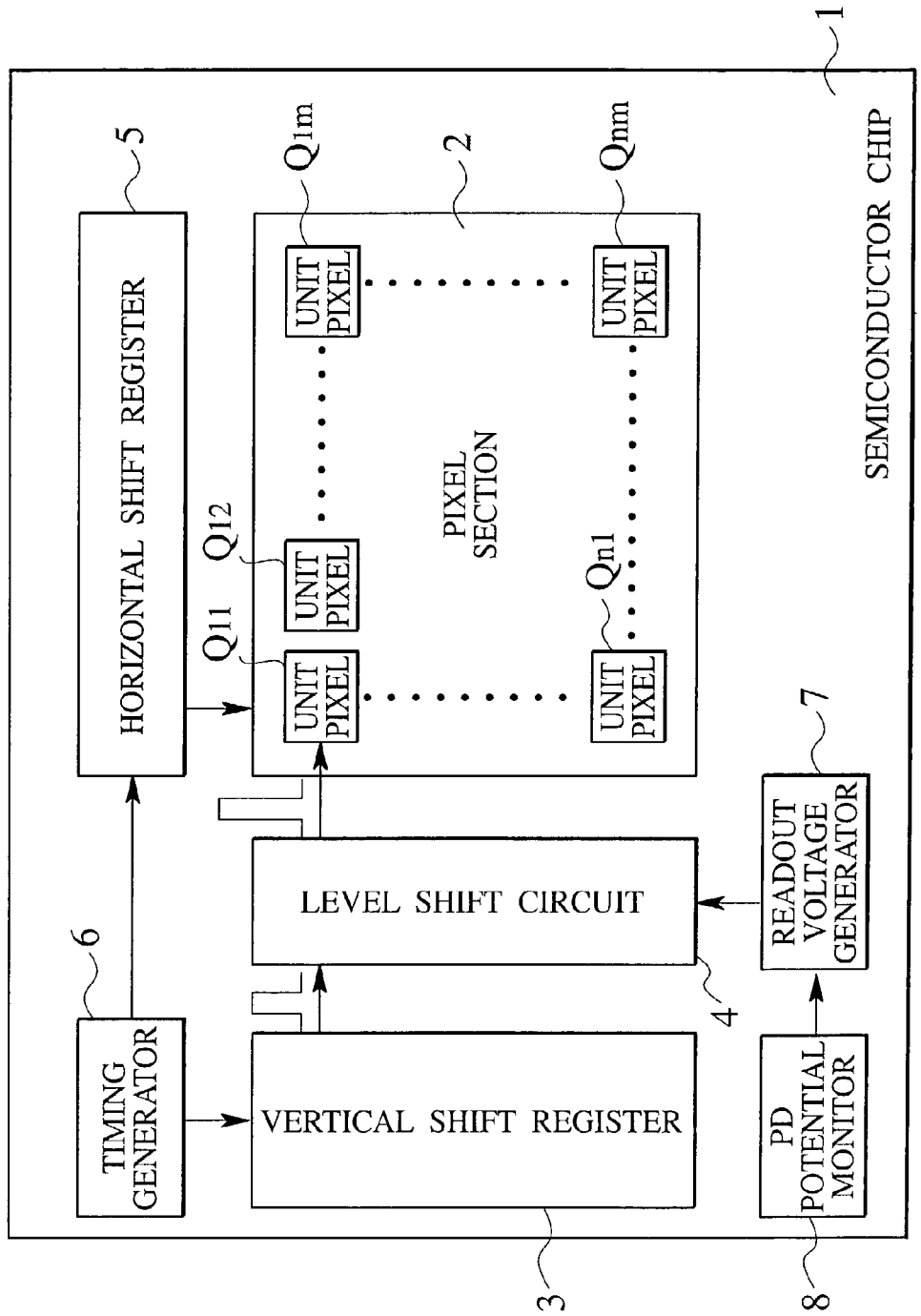

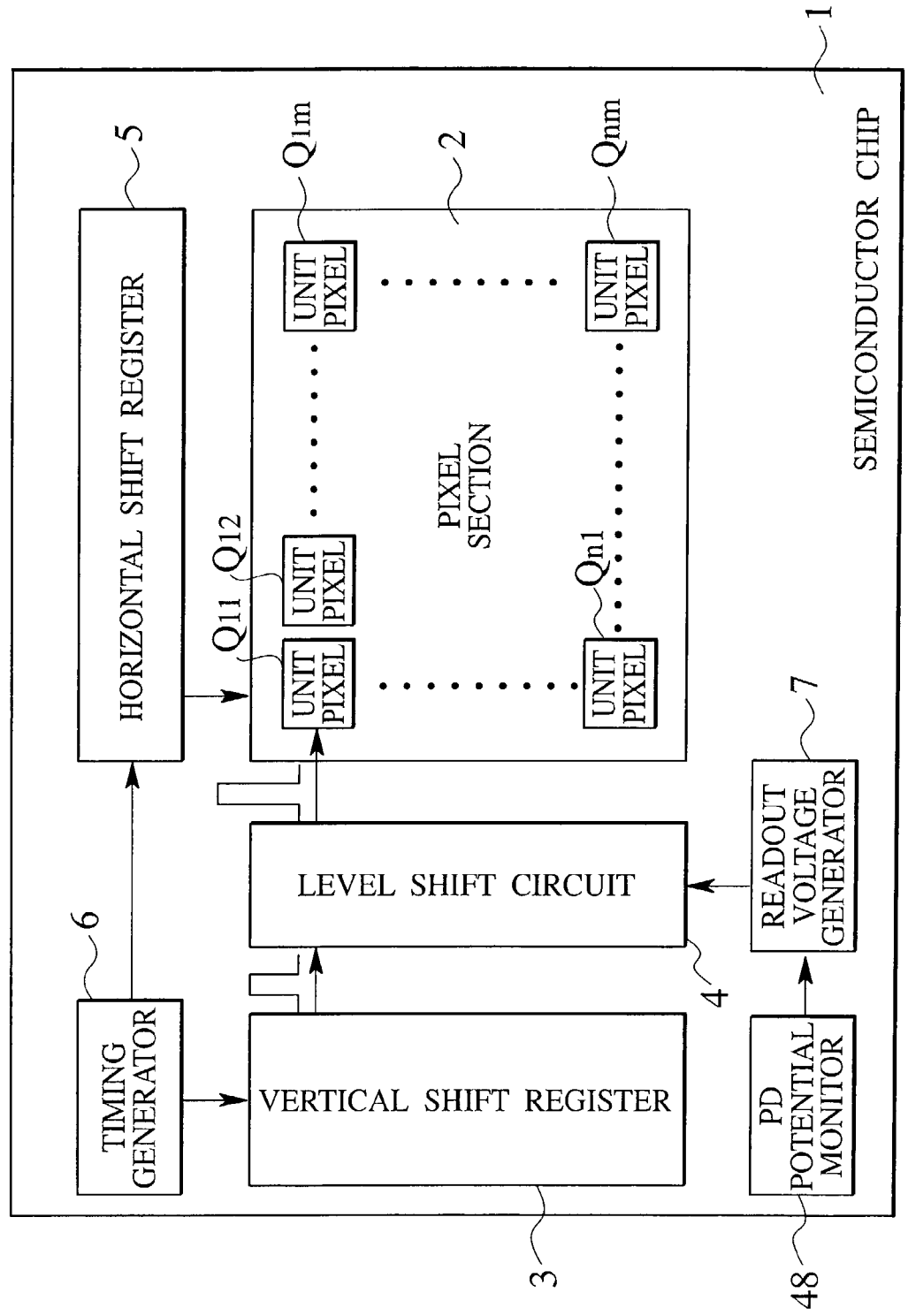

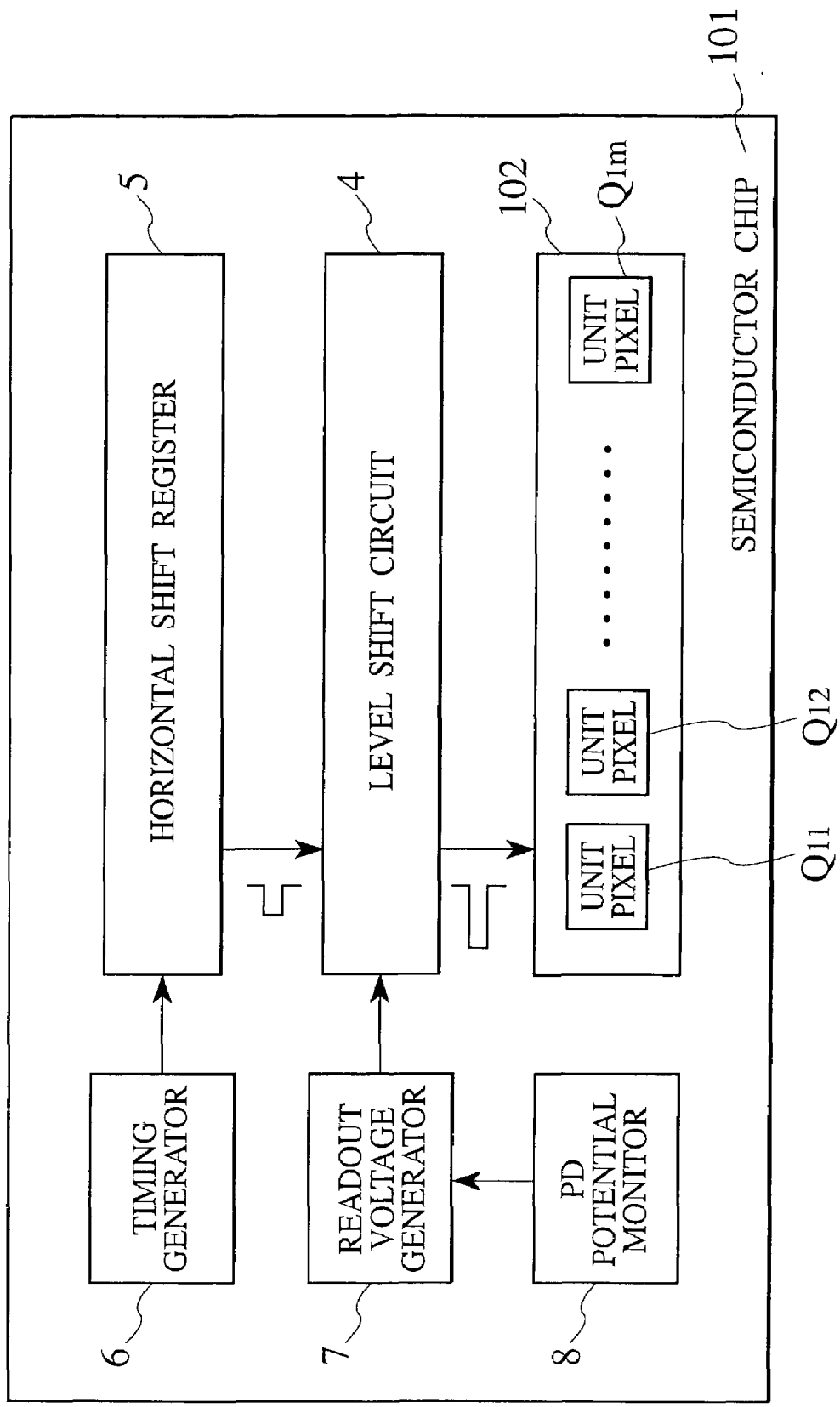

SOLID STATE IMAGING APPARATUS

CROSS REFERENCE TO RELATED APPLICATIONS

This application is based upon and claims the benefit of priority from the prior Japanese Patent Application P2001-381910 filed on Dec. 14, 2001; the entire contents of which are incorporated herein by reference.

BACKGROUND OF THE INVENTION

1. Field of the Invention

The present invention relates to a solid state imaging apparatus, in particular, to a CMOS image sensor, which varies a readout voltage of signal charges in accordance with potential levels related to a photodiode.

2. Description of Related Art

Solid state photoelectrical converters, that is, semiconductor light image sensors, are roughly classified into two categories; CCD image sensors and CMOS image sensors. The CCD image sensors are actually widely put into practical use. However, a photoelectrical conversion section (pixel section) of the CCD image sensor and a peripheral circuit section thereof are fabricated using different procedures. On the other hand, a pixel section and a peripheral circuit section of the CMOS image sensor can be fabricated using almost the same procedure as that of a normal CMOS process, and can be incorporated into the same substrate when manufacturing the CMOS image sensor.

The pixel section of the CMOS image sensor includes a plurality of unit pixels arranged in the form of a matrix. Each of the unit pixels includes, as shown in FIG. 1A, a photodiode 64 and a readout transistor 65 configured to read out signal charges accumulated in the photodiode 64. A gate voltage generator 76 is connected to a gate electrode of the readout transistor 65. A select switch 74 switches a voltage applied to the gate electrode so as to turn on and off the readout transistor 65. A power supply 90 generating a constant power supply voltage Vd is configured to be connected to the ON (High) side of the select switch 74, whereas a ground potential is applied to the OFF (Low) side of the select switch 74.

As shown in FIG. 1B, a gate electrode 92 is placed on a silicon substrate 77 with a gate insulating film 91 therebetween. A buried photodiode 64 is placed at left side of the gate electrode 92. As shown in FIG. 1C, when a ground potential is applied to the gate electrode 92, a potential under the gate electrode 92 decreases to a channel potential (Low) cpa. In FIGS. 1C and 1D, the potential is measured in a downward direction. Signal charges 75a generated by the photodiode 64 are confined above a depletion potential dp of the photodiode 64 by a potential barrier having a barrier height of cpa-dp. When the power supply voltage Vd is applied to the gate electrode 92, a potential under the gate electrode 92 increases to a channel potential (High) cpb. As a result, the potential barrier is eliminated, and therefore, the confined signal charges 75a pass through the channel under the gate electrode 92 to be read out selectively.

By maintaining the relation of dp<cpb in the readout operation of the signal charges, all the signal charges can be read out. Accordingly, an after-image phenomenon due to the remaining signal charges after readout does not occur. If a channel potential (High) cpb' becomes lower than the depletion potential dp, the potential barrier remains in the channel under the gate electrode 92 as shown in FIG. 1D. Therefore, a part of signal charge 75b remains in the photodiode 64 after readout, resulting in deterioration of after-image characteristics of the CMOS image sensor.

Therefore, the power supply voltage Vd is set higher than actually needed with respect to the depletion potential dp so that the relation of dp<cpb is always maintained, even if variation in fabrication occurs in the depletion potential dp.

However, when the power supply voltage Vd to be applied to the gate electrode 92 is set high, the breakdown voltage of the gate insulating film 91 is deteriorated. Therefore, DC failures are likely to occur. More specifically, since the power supply voltage Vd applied to the gate electrode 92 of the transistor 65 is set higher than necessary in order to prevent the deterioration of the after-image characteristics, the probability of occurrence of DC failures increases.

SUMMARY OF THE INVENTION

A first aspect of the present invention provides a solid state imaging apparatus having a plurality of unit pixels, each pixel including a photodiode and a first readout transistor connected to the photodiode, a monitor including a monitor resistor, configured to measure a depletion potential of the monitor resistor, and a readout voltage generator configured to generate a readout voltage to be applied to a first control electrode of the first readout transistor based on the depletion potential. The monitor resistor has the same impurity concentration distribution as that of the photodiode.

A second aspect of the present invention provides a solid state imaging apparatus having a plurality of unit pixels, each pixel including a photodiode and a first readout transistor connected to the photodiode, a monitor including a monitor resistor, configured to measure a depletion potential of the monitor resistor, and a readout voltage generator configured to generate a readout voltage to be applied to a first control electrode of the first readout transistor based on the depletion potential. The monitor resistor has the same depletion potential as that of the photodiode.

BRIEF DESCRIPTION OF THE DRAWINGS

FIG. 2 is a block diagram showing the entire configuration of a CMOS image sensor according to a first embodiment of the present invention;

FIG. 7 is a block diagram showing the entire configuration of a CMOS image sensor according to a second embodiment of the present invention;

FIG. 12 is a block diagram showing the entire configuration of a one-dimensional CMOS image sensor according to another embodiment of the present invention.

DETAILED DESCRIPTION OF EMBODIMENTS

Figure 1A:
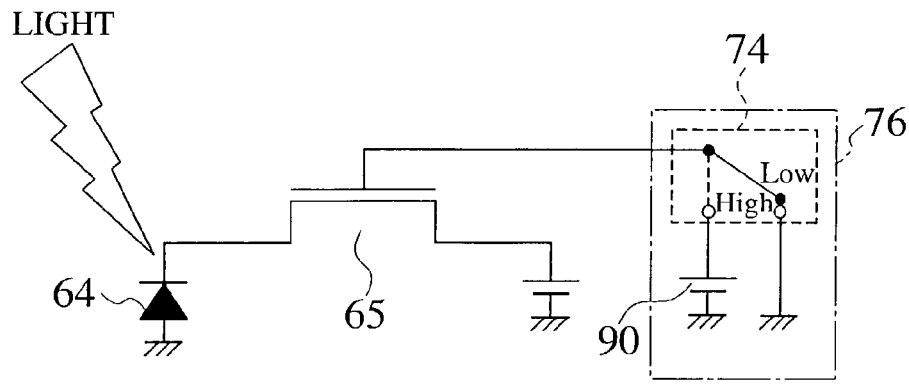
FIG. 1A is a circuit diagram showing a circuit configuration of a unit pixel in a simplified manner, according to the related art.
Figure 1B:
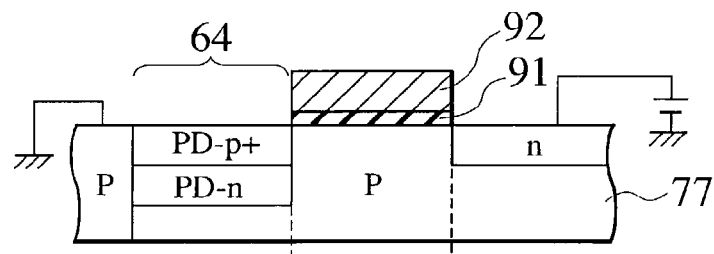
FIG. 1B is a cross-sectional view showing actual device structures of a readout transistor and a photodiode shown in FIG. 1A.
Figure 1C:
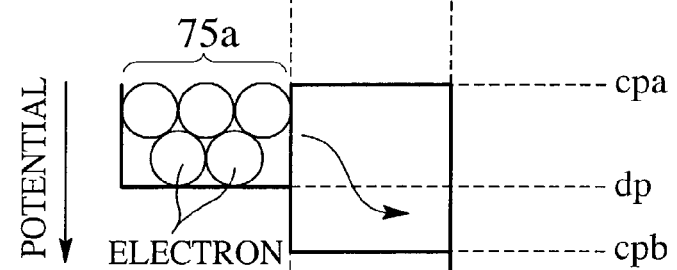
FIG. 1C is a schematic view showing a channel potential of the readout transistor and a depletion potential of the photodiode shown in FIG. 1B, where dp<cpb.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 2, a CMOS image sensor according to a first embodiment of the present invention includes a pixel section 2 having a plurality of unit pixels $Q_{11}$, $Q_{12}$, ..., $Q_{1m}$, ..., $Q_{n1}$, ... and $Q_{nm}$ arranged in the form of a matrix, a level shift circuit 4 connected to the pixel section 2, a vertical shift register 3 connected to the level shift circuit 4, a horizontal shift register 5 connected to the pixel section 2, a timing generator 6 connected to the vertical shift register 3 and the horizontal shift register 5, a readout voltage generator 7 connected to the level shift circuit 4, and a photo diode (PD) potential monitor 8 connected to the readout voltage generator 7. The pixel section 2, the level shift circuit 4, the vertical shift register 3, the horizontal shift register 5, the timing generator 6, the readout voltage generator 7, and the PD potential monitor 8 are merged in a single semiconductor chip 1.

The vertical shift register 3 vertically scans a readout signal for reading out signal charges held in each of the unit pixels $Q_{11}$, $Q_{12}$, ..., $Q_{1m}$, ..., $Q_{n1}$, ... and $Q_{nm}$. The horizontal shift register 5 horizontally scans a readout signal. The timing generator 6 determines the operation timings of the vertical shift register 3 and the horizontal shift register 5. The PD potential monitor 8 measures a depletion potential (a first depletion potential) of a monitor resistor having a similar configuration to that of a photodiode disposed within each of the unit pixels $Q_{11}$, $Q_{12}$, ..., $Q_{1m}$, ..., $Q_{n1}$, ... and $Q_{nm}$. The readout voltage generator 7 supplies a readout voltage, which is adjusted based on the result of measurement by the PD potential monitor 8, to the level shift circuit 4. The "readout voltage" serves to read out signal charges accumulated in the photodiode within each of the unit pixels $Q_{11}$, $Q_{12}$, ..., $Q_{1m}$, ..., $Q_{n1}$, ... and $Q_{nm}$. The level shift circuit 4 amplifies a readout signal to a readout voltage.

Figure 3:
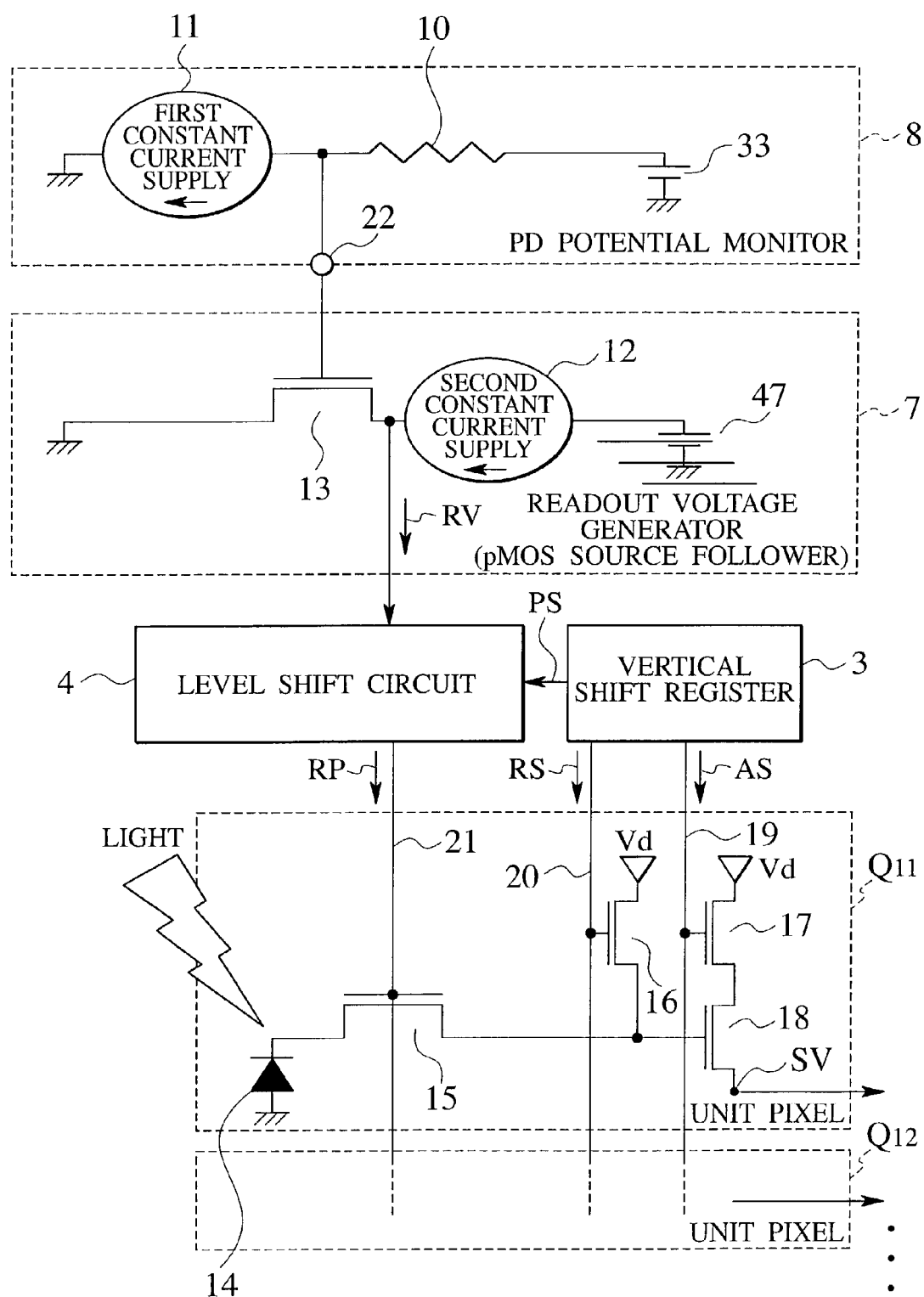
FIG. 3 is a view showing circuit configurations of a unit pixel, a PD potential monitor, and a readout voltage generator shown in FIG. 2, illustrating a concrete connection relationship therebetween.

As shown in FIG. 3, the unit pixel $Q_{11}$ includes a photodiode 14 having a grounded anode terminal, a first readout transistor 15 connected to an cathode terminal of the photodiode 14, a reset transistor 16 connected to the first readout transistor 15, an amplifying transistor 18 connected to the first readout transistor 15 and the reset transistor 16, and a row select transistor 17 connected to the amplifying transistor 18. One main electrode (source electrode) of the first readout transistor 15 is connected to the cathode terminal of the photodiode 14, whereas the other main electrode (drain electrode) of the first readout transistor 15 is connected to a source electrode of the reset transistor 16. A control electrode (gate electrode) of the first readout transistor 15 is connected to the level shift circuit 4 via a readout signal line 21. A power supply voltage Vd is applied to a drain electrode of the reset transistor 16, whereas a gate electrode of the reset transistor 16 is connected to the vertical shift register 3 via a reset signal line 20. The row select transistor 17 and the amplifying transistor 18 are connected to each other in series. A power supply voltage Vd is applied to a drain electrode of the row select transistor 17. A gate electrode of the row select transistor 17 is connected to the vertical shift register 3 via an address signal line 19. A gate electrode of the amplifying transistor 18 is connected to the other main electrode (drain electrode) of the first readout transistor 15 and the source electrode of the reset transistor 16. Although the illustration is herein omitted, each of the other unit pixels $Q_{12}$, ..., $Q_{1m}$, ..., $Q_{n1}$, ..., and $Q_{nm}$ shown in FIG. 2 has a similar circuit configuration to that of the unit pixel $Q_{11}$. The address signal line 19, the reset signal line 20 and the readout signal line 21 are similarly connected to the other horizontally adjacent unit pixels $Q_{12}$ ... and $Q_{1m}$. A source electrode of the amplifying transistor 18 is connected to a source electrode of an amplifying transistor in each of the other vertically adjacent unit pixels $Q_{21}$ ... and $Q_{n1}$.

The PD potential monitor 8 includes a monitor resistor 10 having a similar impurity concentration distribution to that of the photodiode 14 in each of the unit pixels $Q_{11}$, $Q_{12}, \ldots, Q_{1m}, \ldots, Q_{n1}, \ldots,$ and $Q_{nm}$, a power supply 33 connected to one terminal of the monitor resistor 10, a constant current supply (hereinafter, referred to as a "first constant current supply") 11 connected to the other terminal of the monitor resistor 10, and a monitor terminal 22 connected between the first constant current supply 11 and the monitor resistor 10. The power supply 33 supplied a positive voltage to one terminal of the monitor resistor 10. The first constant current supply 11, which is connected between a ground potential and the monitor resistor 10, provides a constant current from the power supply 33 via the monitor resistor 10. The monitor terminal 22 monitors a first depletion potential of the monitor resistor 10.

The readout voltage generator 7 includes a p-type MOS transistor 13 having a gate electrode connected to the monitor terminal 22, a second constant current supply 12 connected to a source electrode of the p-type MOS transistor 13, and a power supply 47 connected to the second constant current supply 12. A drain electrode of the p-type MOS transistor 13 is grounded. A potential between the first constant current supply 11 and the monitor resistor 10 is applied to a gate electrode of the p-type MOS transistor 13. The p-type MOS transistor 13 forms a source follower circuit. A potential between the p-type MOS transistor 13 and the second constant current supply 12 is supplied to the level shift circuit 4 as a readout voltage RV. The requirement for the readout voltage generator 7 is that the readout voltage RV is lower than the power supply voltage Vd. In the case where the readout voltage RV is higher than the power supply voltage Vd, it is sufficient for the readout voltage generator 7 to generally use a booster circuit to generate the readout voltage RV.

The level shift circuit 4 amplifies a pulse signal PS supplied from the vertical shift register 3 based on the readout voltage RV and generates a pulsed readout signal (readout pulse signal) RP. The readout pulse signal RP is selectively applied to the gate electrode of the first readout transistor 15 in each of the unit pixels $Q_{11}$, $Q_{12}$, ..., $Q_{1m}, \ldots, Q_{n1}, \ldots$ and $Q_{nm}$ via the readout signal line 21.

Figure 4A:
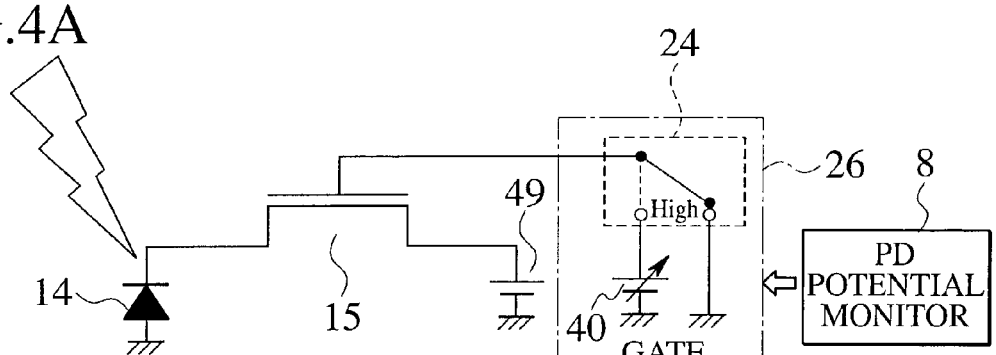
FIG. 4A is a circuit diagram of the unit pixel shown in FIG. 3, which is simplified for describing a readout operation.

FIG. 4A is a circuit diagram where a part of the configuration of FIG. 3 is simplified in order to illustrate operations of the photodiode 14 and the first readout transistor 15 shown in FIG. 3. More specifically, instead of the readout voltage generator 7 and the level shift circuit 4 shown in FIG. 3, a gate voltage generator 26 is equivalently connected to a gate electrode of the first readout transistor 15. Moreover, instead of the reset transistor 16, the row select transistor 17 and the amplifying transistor 18 shown in FIG. 3, a power supply 49 equivalently is connected to the drain electrode of the first readout transistor 15.

As shown in FIG. 4A, the anode terminal of the photodiode 14 is grounded, whereas the cathode terminal thereof is connected to a source electrode of the first readout transistor 15. The gate voltage generator 26 controls ON/OFF of the first readout transistor 15. The power supply 49 applies a positive voltage to the drain electrode of the first readout transistor 15.

The gate voltage generator 26 includes a select switch 24 having two terminals, i.e., the Low-side and High-side terminals. The Low-side terminal is grounded, whereas a power supply 40 having a varying voltage level is connected to the High-side terminal. When the select switch 24 is turned to the Low-side termimal, a ground potential is applied to the gate electrode of the first readout transistor 15, and the first readout transistor 15 is set to an OFF state. On the other hand, when the select switch 24 is turned to the High-side terminal, a positive potential is applied to the gate electrode of the first readout transistor 15, and the first readout transistor 15 is set to an ON state. A voltage level of the power supply 40 is determined based on the first depletion potential of the monitor resistor, which is measured in an approximate manner by the PD potential monitor 8.

Figure 4B:
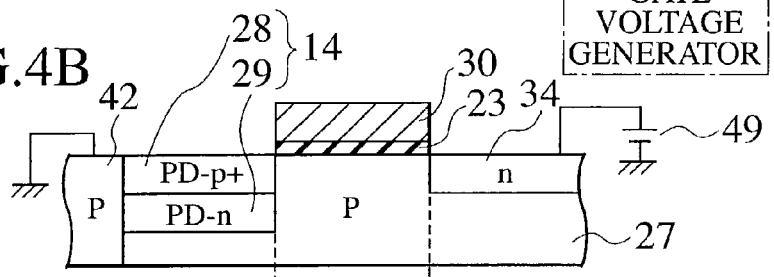
FIG. 4B is a cross-sectional view showing actual device structures of a photodiode and a first readout transistor shown in FIG. 4A.

FIG. 4B shows the arrangement of the photodiode 14 and the first readout transistor 15 shown in FIG. 4A in an actual device. A first gate electrode 30 is placed on a p-type silicon substrate 27 through a first gate insulating film 23. The buried photodiode 14 and an n-type drain region 34 are placed in the upper portion of the silicon substrate 27 at both sides of the first gate electrode 30. The photodiode 14 includes a first p-type semiconductor region (hereinafter, referred to as "a first $p^+$-type PD region") 28 placed in an upper portion including a surface of the silicon substrate 27, and a first n-type semiconductor region (hereinafter, referred to as "a first n-type PD region") 29 placed inside the silicon substrate 27 so as to be adjacent to the first $p^+$-type PD region 28. A p-type region 42 is disposed in an upper portion at the surface of the silicon substrate 27 so as to be adjacent to the photodiode 14. The p-type region 42 is grounded. Since a depletion potential (a second depletion potential) of the photodiode 14 is determined depending on impurity concentration distributions of the first $p^+$-type PD region 28 and the first n-type PD region 29, the second depletion potential may vary among wafers or lots due to variation in fabrication processes.

Figure 5A:
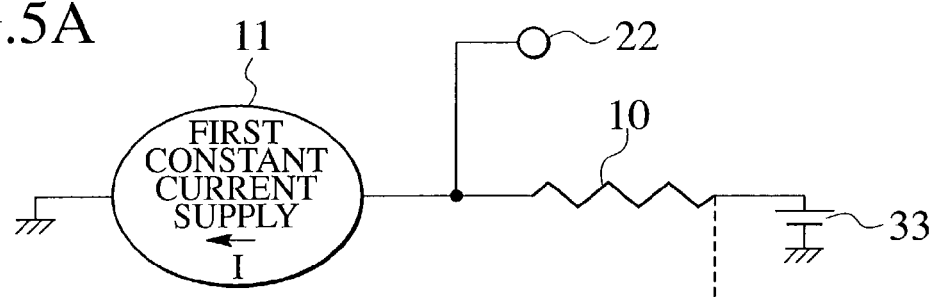
FIG. 5A is a circuit diagram showing the PD potential monitor shown in FIG. 3.

FIG. 5A shows the PD potential monitor 8 in an extracted manner in order to describe the operation of the PD potential monitor 8 shown in FIG. 3. A monitor terminal 22, configured to monitor the first depletion potential of the monitor resistor 10, is connected between the first constant current supply 11 and the monitor resistor 10. A current I flows through the monitor resistor 10 from the first constant current supply 11.

Figure 5B:
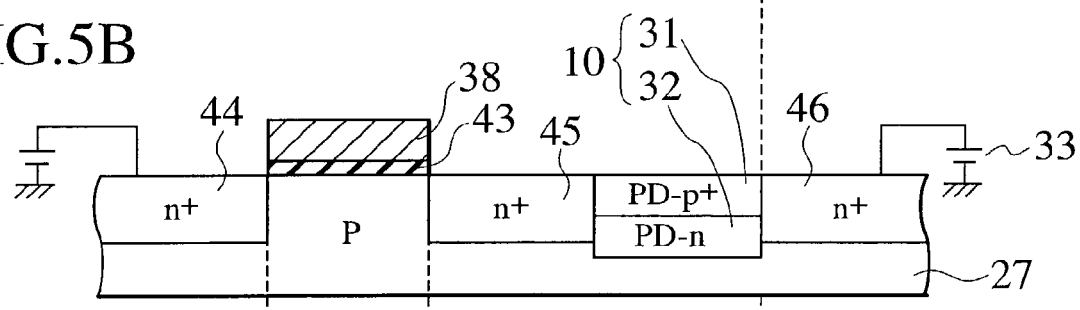
FIG. 5B is a cross-sectional view showing actual device structures of a monitor resistor and a first constant current supply shown in FIG. 5A.

FIG. 5B shows a cross-sectional structure of the PD potential monitor 8 shown in FIG. 5A in an actual device. An n-type MOS transistor designed so as to operate in a pentode region is used as the first constant current supply 11 shown in FIG. 5A. The n-type MOS transistor includes a second gate electrode 38 placed on the silicon substrate 27 with a second gate insulating film 43 therebetween, as well as an $n^+$-type source region 44 and an $n^+$-type drain region 45. The $n^+$-type source region 44 and the $n^+$-type drain region 45 are placed in an upper portion of the silicon substrate 27 including a surface thereof at both sides of the second gate electrode 38. The monitor resistor 10 includes a second p-type semiconductor region (hereinafter, referred to as "a second $p^+$-type PD region") 31 placed in an upper portion including the surface of the silicon substrate 27 and a second n-type semiconductor region (hereinafter, referred to as "a second n-type PD region") 32 disposed under the second $p^+$-type PD region 31. Both of the second $p^+$-type PD region 31 and the second n-type PD region 32 are placed adjacent to the $n^+$-type drain region 45. The monitor resistor 10 has a similar cross-sectional structure as that of the photodiode 14 shown in FIG. 4B. Impurity concentration distributions of the second $p^+$-type PD region 31 and the second n-type PD region 32 have substantially the same profiles as those of the impurity concentration distributions of the first $p^+$-type PD region 28 and the first n-type PD region 29 shown in FIG. 4B. Therefore, it can be considered that the second depletion potential of the photodiode 14 is substantially identical to the first depletion potential of the monitor resistor 10. The monitor resistor 10 uses the second n-type PD region 32 as a resistive element. A positive potential is applied to one terminal of the second n-type PD region 32 by the power supply 33 through an n$^+$-type region 46. The n$^+$-type drain region 45 is connected to the other terminal of the second n-type PD region 32.

The photodiodes 14 are placed in each of the plurality of unit pixels $Q_{11}, \ldots, Q_{1m}, \ldots, Q_{n1}, \ldots$ and $Q_{nm}$ arranged in the form of a matrix within the pixel section 2, as shown in FIG. 2. On the other hand, the monitor resistor 10 is formed within the PD potential monitor 8 placed on the peripheral space of the semiconductor chip 1.

Next, an operation of the CMOS image sensor according to the first embodiment of the present invention will be described. As shown in FIG. 3, the reset transistor 16 is turned ON by the reset signal RS from the vertical shift register 3, and the potential of the gate electrode of the amplifying transistor 18 is set to an initial state (power supply voltage: Vd). At this moment, the first readout transistor 15 is in an OFF state. Thereafter, the reset transistor 16 is set to an OFF state.

When the photodiode 14 is irradiated with light, electron-hole pairs, the number of which is in proportion to the amount of light, are generated due to photoelectric effects. The holes escape from the anode region of the photodiode 14 toward the ground potential, whereas the electrons are accumulated in the cathode region of the photodiode 14. The electrons accumulated in the cathode region correspond to the signal charges accumulated in the photodiode 14. Since there is a limit in the amount of charges which the photodiode 14 can accumulate therein, it is necessary to perform an operation for regularly reading out the signal charges. Upon readout of the signal charges, the first readout transistor 15 is turned ON by the readout pulse signal RP. Then, the signal charges accumulated in the photodiode 14 pass through the channel of the first readout transistor 15 and are injected to the gate electrode of the amplifying transistor 18. Then, the potential of the gate electrode of the amplifying transistor 18 is dropped from the initial state (Vd) by the amount of the signal charges. When the row select transistor 17 receives an address selection signal AS to be turned ON, a source voltage SV in accordance with the amount of signal charges injected to the gate electrode of the amplifying transistor 18 is outputted from the source electrode of the amplifying transistor 18.

Figure 4C:
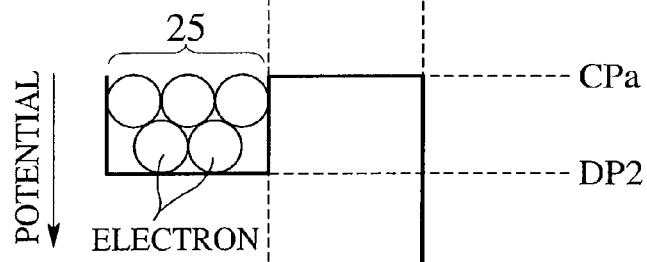
FIG. 4C is a schematic view showing a channel potential of the first readout transistor and a depletion potential of the photodiode when the first readout transistor shown in FIG. 4B is in an OFF state.
Figure 4D:
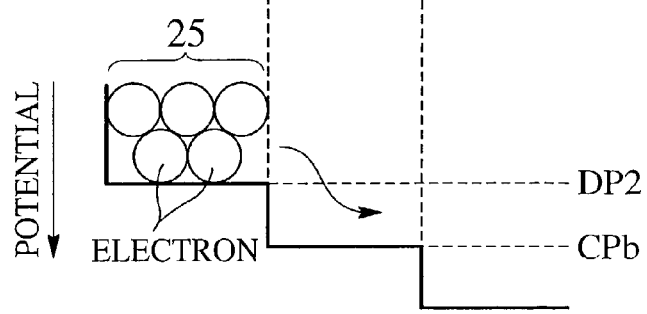
FIG. 4D is a schematic view showing a channel potential of the first readout transistor and a depletion potential of the photodiode when the first readout transistor shown in FIG. 4B is in an ON state.

As shown in FIG. 4C, when the first readout transistor 15 is in an OFF state, a channel potential (Low) CPa decreases immediately below the first gate electrode 30 of the first readout transistor 15. In FIGS. 4C and 4D, the potential is measured in a downward direction. The channel potential (Low) CPa is a potential of the p-type silicon substrate 27 just below the first gate electrode 30 adjacent to the photodiode 14 at the second depletion potential DP2. The p-type region 42 is grounded, and the channel potential (Low) CPa is lower than the second depletion potential DP2. Thus, the potential of the p-type region 42 and the second depletion potential DP2 form a potential barrier with respect to the channel potential (Low) CPa. The signal charges 25 are confined and accumulated within the n-type region 29 of the photodiode 14 by this potential barrier, the potential at n-type region 29 is set to be the second depletion potential DP2.

As shown in FIG. 4D, when the first readout transistor 15 is in an ON state, the potential of the p-type silicon substrate 27 just below the first gate electrode 30 of the first readout transistor 15 increases to a channel potential (High) CPb. The channel potential (High) CPb is higher than the second depletion potential DP2 of the photodiode 14. More specifically, the second depletion potential DP2 and the channel potential (High) CPb satisfies the relation expressed by the following Eq. (1):

$$DP2 < CPb \tag{1}$$

Figure 1D:
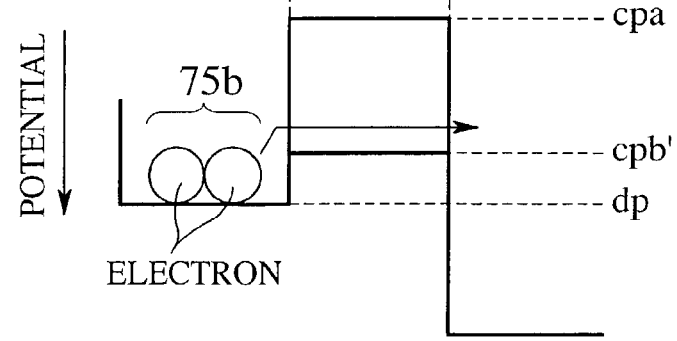
FIG. 1D is a schematic view showing a channel potential of the readout transistor and a depletion potential of the photodiode shown in FIG. 1B, where dp>cpb'.

The voltage level of the power supply 40 shown in FIG. 4A is set so as to satisfy the relation expressed by the Eq. (1). By always maintaining the relation expressed by the Eq. (1), a small potential barrier as shown in FIG. 1D is prevented from being formed. Therefore, the after-image characteristics of the photodiode 14 are not deteriorated. As described above, however, if the channel potential (High) CPb is set to be excessively high with respect to the second depletion potential DP2, DC characteristics of the first readout transistor 15 are deteriorated. Therefore, the PD potential monitor 8 indirectly monitors the second depletion potential DP2 of the photodiode 14 so as to feedback the second depletion potential DP2 to the voltage level of the power supply 40.

Figure 5C:
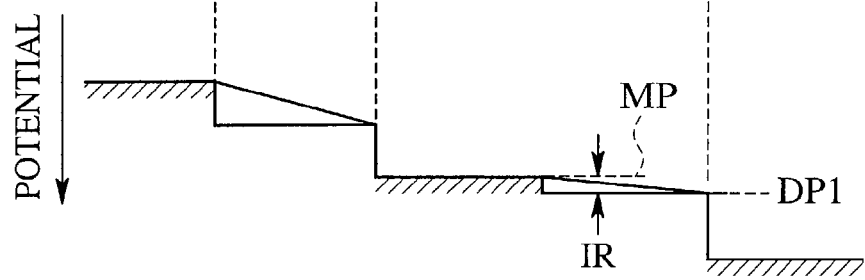
FIG. 5C is a schematic view showing the respective potentials of the monitor resistor and the first constant current supply shown in FIG. 5B.

As shown in FIG. 5B, the monitor resistor 10 uses the second n-type PD region 32 as a resistive element. Therefore, assuming that a resistance value of the second n-type PD region 32 is R, a voltage drop for IR occurs in the monitor resistor 10 as shown in FIG. 5C. Thus, a monitor potential MP, which is lower than the first depletion potential DP1 of the monitor resistor 10 by IR, is outputted to the readout voltage generator 7 shown in FIG. 3 via the monitor terminal 22. In the case where the voltage drop (IR) due to the monitor resistor 10 is negligibly small with respect to the first depletion potential DP1, the monitor potential MP can be regarded as the first depletion potential DP1. More specifically, the PD potential monitor 8 is allowed to output, in an approximate manner, the monitor potential MP as the first depletion potential DP1 to the readout voltage generator 7 shown in FIG. 3.

The monitor potential MP is converted into a readout voltage RV in consideration of a threshold voltage level of the first readout transistor 15 and the like, by the first readout voltage generator 7 shown in FIG. 3. The level shift circuit 4 amplifies the pulse signal PS supplied from the vertical shift register 3 based on the readout voltage RV to generate the readout pulse signal RP. The readout pulse signal RP is selectively applied to the gate electrode of the first readout transistor 15 within each of the unit pixels $Q_{11}, Q_{12}, \ldots, Q_{1m}, \ldots, Q_{n1}, \ldots$ and $Q_{nm}$ via the readout signal line 21.

As described above, the second depletion potential DP2 of the photodiode 14 varies for each wafer or each lot due to variation in fabrication conditions and the like. Therefore, the second depletion potential DP2 of the photodiode 14 is indirectly monitored for each chip by using the PD potential monitor 8. Then, a voltage level, which allows the relation expressed by the Eq. (1) to be maintained and does not deteriorate the DC characteristics of the first readout transistor 15, is applied to the first gate electrode 30 of the first readout transistor 15. More specifically, the minimal voltage level, which does not lead to the deterioration of the after-image characteristics, is applied to the first gate electrode 30 of the first readout transistor 15. Therefore, it is possible to provide a CMOS image sensor without any deterioration in the after-image characteristics while minimizing the occurrence of DC failures.

It is sufficient to apply a relatively high readout voltage to the first gate electrode 30 only for a CMOS image sensor including a photodiode having the relatively high depletion potential, that is, having the relatively poor after-image characteristics. Therefore, it is possible to provide a CMOS image sensor without any deterioration in after-image characteristics while decreasing the probability of the occurrence of DC failures.

It is desirable that the first constant current supply 11 stably provides a relatively small current I by appropriately setting a width (W) and a length (L) of the channel of the n-type MOS transistor operating in a pentode region. For example, a desirable setting of I is approximately the range of about 0.2 to 20 μA. In addition, it is also desirable to approximately set a width (W) and a length (L) of the monitor resistor 10 so that R is made small. For example, a desirable setting of R is approximately the range of about 5 to 500 kΩ. Moreover, it is desirable to design the actual circuit so as to satisfy the relation: 10×IR<Vd.

Next, an example of a fabrication method of the unit pixel shown in FIG. 4B and the PD potential monitor shown in FIG. 5B will be described with reference to FIGS. 6A to 6E.

Figure 6A:
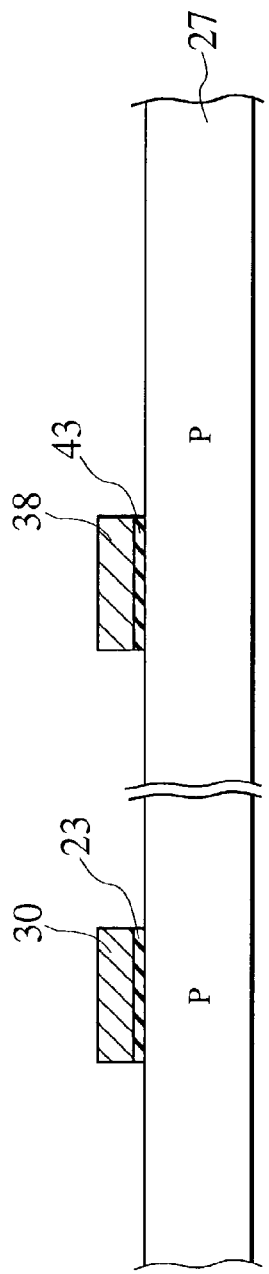
FIGS. 6A to 6E are cross-sectional diagrams showing a fabrication process of the unit pixel shown in FIG. 4B and the PD potential monitor shown in FIG. 5B.

(1) First, a gate insulating film and a gate electrode film are sequentially deposited on the silicon substrate 27 by using a chemical vapor deposition (CVD) method. Part of the gate insulating film and the gate electrode film are selectively removed by using a photolithography method and an anisotropic etching method. As a result, as shown in FIG. 6A, the first gate insulating film 23, the second gate insulating film 43, the first gate electrode 30 and the second gate electrode 38 are simultaneously produced on the silicon substrate 27.

Figure 6B:
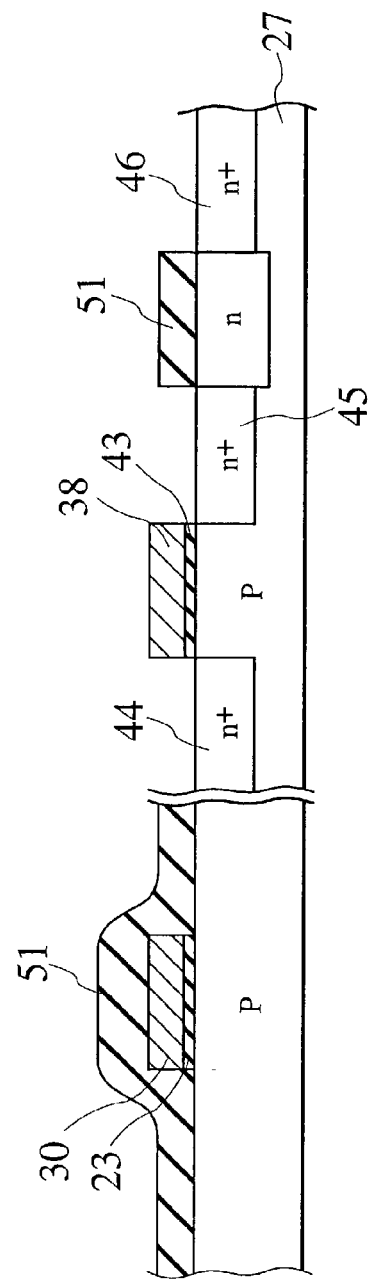

(2) A first mask 51 having openings in the regions where the n$^+$-type source region 44, the n$^+$-type drain region 45 and the n$^+$-type region 46 are to be produced and where the second gate electrode 38 exists, is formed by the photolithography method and the anisotropic etching method. N-type impurity ions are selectively implanted into the silicon substrate 27 through the openings in the first mask 51 by ion implantation. A thermal treatment is conducted to produce the n$^+$-type source region 44, the n$^+$-type drain region 45 and the n$^+$-type region 46, as shown in FIG. 6B.

Figure 6C:
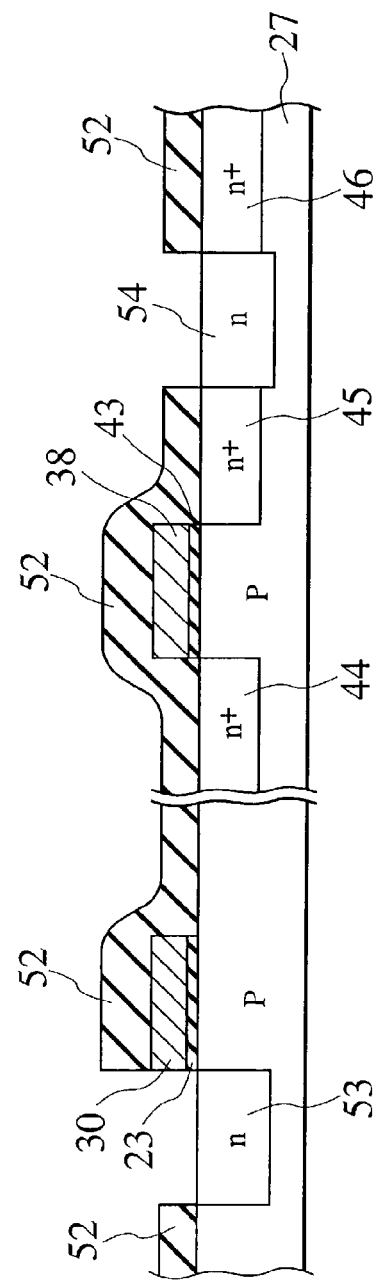

(3) After removal of the first mask 51, a second mask 52 having openings in the regions where the photodiode 14 and the monitor resistor 10 are to be produced, is formed by using the photolithography method and the anisotropic etching method. N-type impurity ions are selectively implanted into the silicon substrate 27 through the openings in the second mask 52 by ion implantation. A thermal treatment is conducted to form a first n-type region 53 and a second n-type region 54, as shown in FIG. 6C.

Figure 6D:
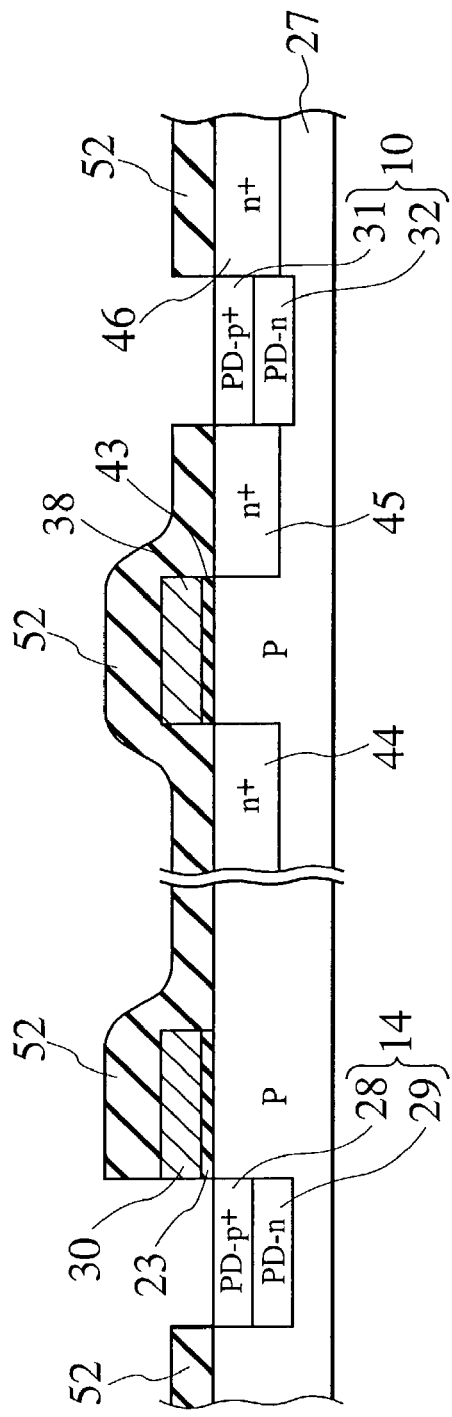

(4) P-type impurity ions are selectively implanted into the silicon substrate 27 through the openings in the second mask 52 by ion implantation. The p-type impurity ions are shallowly implanted as compared with the first and second n-type regions 53 and 54. A thermal treatment is conducted to produce the first p$^+$-type PD region 28 and the second p$^+$-type PD region 31 in the regions where the p-type impurity ions are implanted, as shown in FIG. 6D. The first n-type region 53 and the second n-type region 54, into which the p-type impurity ions are not doped, become the first n-type PD region 29 and the second n-type PD region 32, respectively.

Figure 6E:
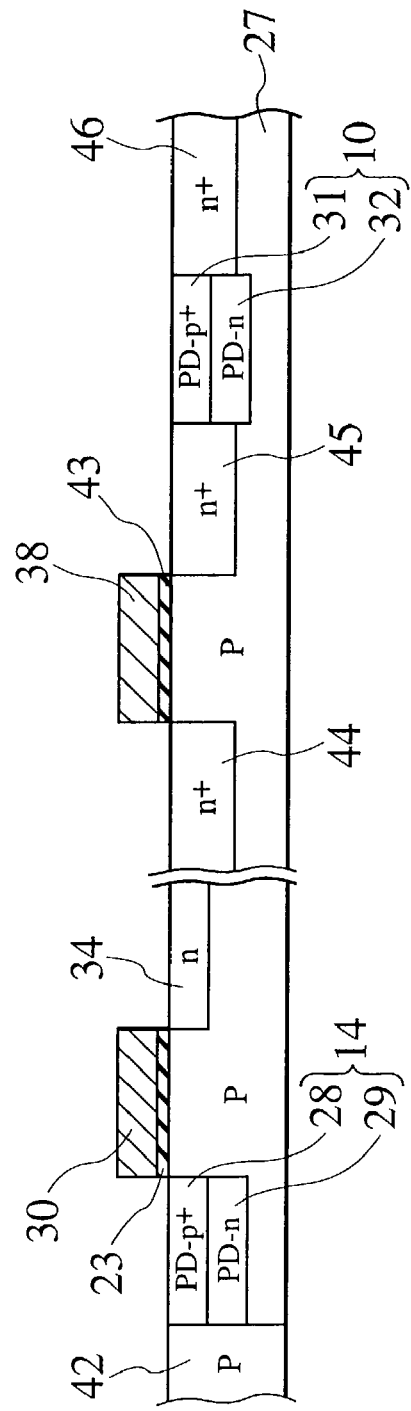

(5) Finally, as shown in FIG. 6E, the n-type drain region 34 is formed using the photolithography method, the anisotropic etching method and the ion implantation. In a similar manner, the p-type region 42 is formed. Since high dose of the p-type impurity is doped to the p-type silicon substrate 27, the p-type region 42 has a higher p-type impurity concentration than that of the original p-type silicon substrate 27. Through the above-described processes, the photodiode 14 and the first readout transistor 15 shown in FIG. 4B, and the monitor resistor 10 and the first constant current supply 11 shown in FIG. 5B can be simultaneously fabricated on the same silicon substrate 27.

As described above, the photodiode 14 and the monitor resistor 10 can be fabricated in the same fabrication processes so that the monitor resistor 10 shown in FIG. 5B has a similar element structure to that of the photodiode 14 shown in FIG. 4B. Thus, the second depletion potential DP2 of the photodiode 14 is substantially identical with the first depletion potential DP1 of the monitor resistor 10.

The process stage forming the first to third n-type regions 44 to 46, the process stage forming the photodiode 14 and the monitor resistor 10, the process stage forming the n-type region 34 and the process stage forming the p-type region 42 can be conducted in any order. The above-described order is merely an example, and therefore, the order of the process stages may be changed in implementation.

According to the first embodiment of the present invention, a solid state imaging apparatus having a high DC yield and reduced variation in after-image characteristics of the photodiode can be provided.

Second Embodiment

As shown in FIG. 7, a CMOS image sensor according to a second embodiment of the present invention includes the pixel section 2 having the plurality of unit pixels $Q_{11}$, $Q_{12}, \ldots, Q_{1m}, \ldots, Q_{n1}, \ldots$ and $Q_{nm}$ arranged in the form of a matrix, the level shift circuit 4 connected to the pixel section 2, the vertical shift register 3 connected to the level shift circuit 4, the horizontal shift register 5 connected to the pixel section 2, the timing generator 6 connected to the vertical shift register 3 and the horizontal shift register 5, the readout voltage generator 7 connected to the level shift circuit 4, and a PD potential monitor 48 connected to the readout voltage generator 7. The pixel section 2, the level shift circuit 4, the vertical shift register 3, the horizontal shift register 5, the timing generator 6, the readout voltage generator 7, and the PD potential monitor 48 are merged in the single semiconductor chip 1. The CMOS image sensor according to the second embodiment has an entirely similar configuration to that of the CMOS image sensor according to the first embodiment.

Figure 8:
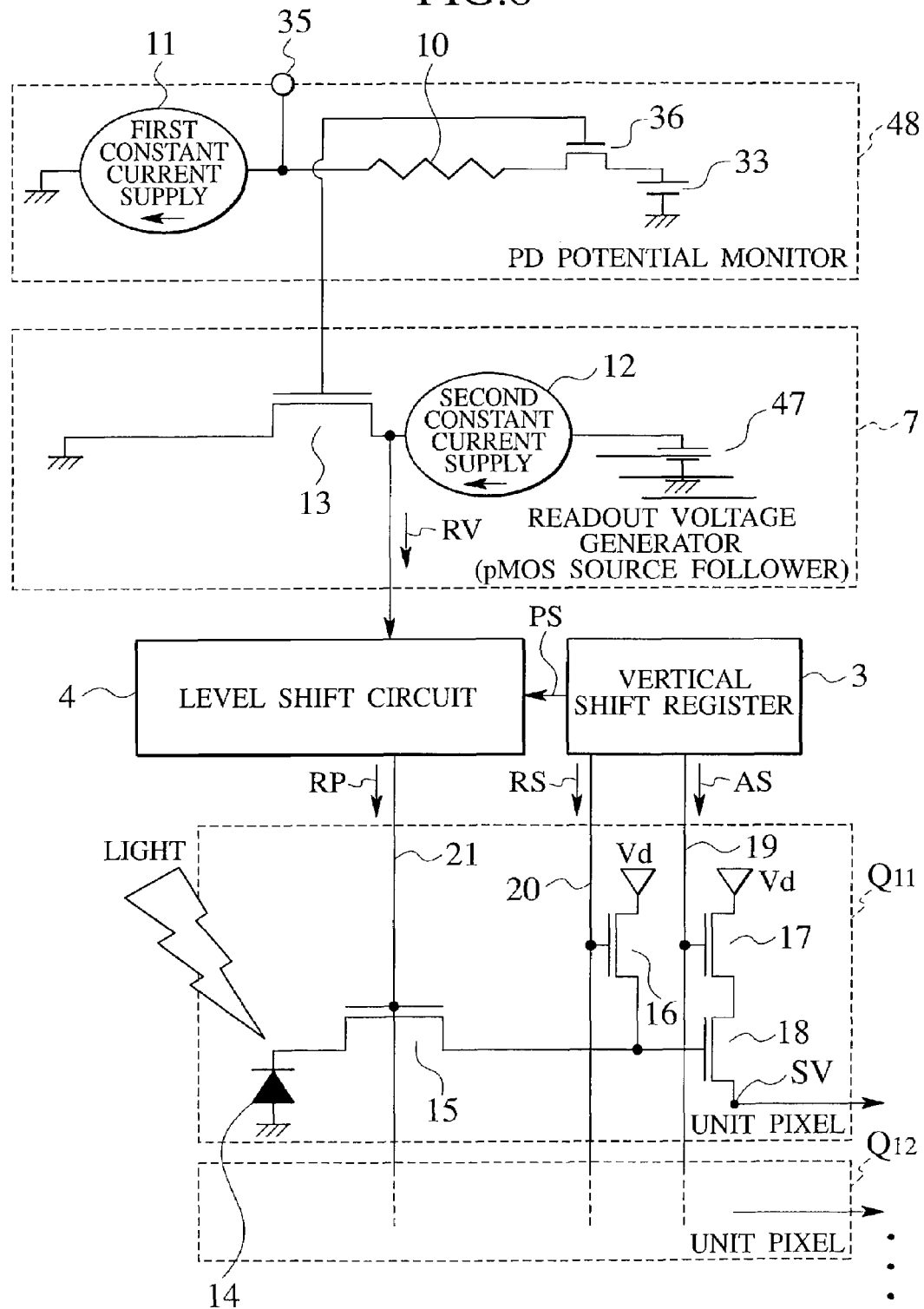
FIG. 8 is a view showing circuit configurations of a unit pixel, a PD potential monitor, and a readout voltage generator shown in FIG. 7, illustrating a concrete connection relationship therebetween.

As shown in FIG. 8, the unit pixel $Q_{11}$ includes the photodiode 14 having the grounded anode terminal, the first readout transistor 15 connected to the cathode terminal of the photodiode 14, the reset transistor 16 connected to the first readout transistor 15, the amplifying transistor 18 connected to the first readout transistor 15 and the reset transistor 16, and the row select transistor 17 connected to the amplifying transistor 18.

The PD potential monitor 48 is provided with the monitor resistor 10 having a similar impurity concentration distribution to that of the photodiode 14 in each of the unit pixels $Q_{11}, Q_{12}, \ldots, Q_{1m}, \ldots, Q_{n1}, \ldots$ and $Q_{nm}$, a second readout transistor 36 connected to one terminal of the monitor resistor 10, the power supply 33 supplies a positive voltage to the second readout transistor 36, the first constant current supply 11 connected to the other terminal of the monitor resistor 10 in series, and a monitor terminal 35 connected between the monitor resistor 10 and the first constant current supply 11. The first constant current supply 11, which is connected between the ground potential and the monitor resistor 10, provides a constant current from the power supply 33 through the second readout transistor 36 and the monitor resistor 10. The PD potential monitor 48 monitors a first depletion potential of the monitor resistor 10 having a similar element structure to that of the photodiode in each of the unit pixels $Q_{11}, Q_{12}, \ldots, Q_{1m}, \ldots, Q_{n1}, \ldots$ and $Q_{nm}$. The PD potential monitor 48 differs from the PD potential monitor 8 shown in FIG. 3 in that the PD potential monitor 48 further includes the second readout transistor 36 connected in series between the power supply 33 and the monitor resistor 10.

The readout voltage generator 7 includes the p-type MOS transistor 13, the second constant current supply 12 connected to the source electrode of the p-type MOS transistor 13, and the power supply 47 connected to the second constant current supply 12. The drain electrode of the p-type MOS transistor 13 is grounded. The p-type MOS transistor 13 serves as a source follower circuit. A gate potential of the second readout transistor 36 is applied to the gate electrode of the p-type MOS transistor 13. A potential between the p-type MOS transistor 13 and the second constant current supply 12 is supplied to the level shift circuit 4 as the readout voltage RV.

The level shift circuit 4 amplifies the pulse signal PS supplied from the vertical shift register 3 based on the readout voltage RV and generates the readout pulse signal RP. The readout pulse signal RP is selectively applied to the gate electrode of the first readout transistor 15 in each of the unit pixels $Q_{11}, Q_{12}, \ldots, Q_{1m}, \ldots, Q_{n1}, \ldots$ and $Q_{nm}$ via the readout signal line 21.

As described above with reference to FIG. 8, although circuit configurations of each of the unit pixels $Q_{11}, Q_{12}, \ldots, Q_{1m}, \ldots, Q_{n1}, \ldots$ and $Q_{nm}$ and the readout voltage generator 7 are the same as those shown in FIG. 3, the PD potential monitor 48 differs from the PD potential monitor 8 shown in FIG. 3.

Figure 9A:
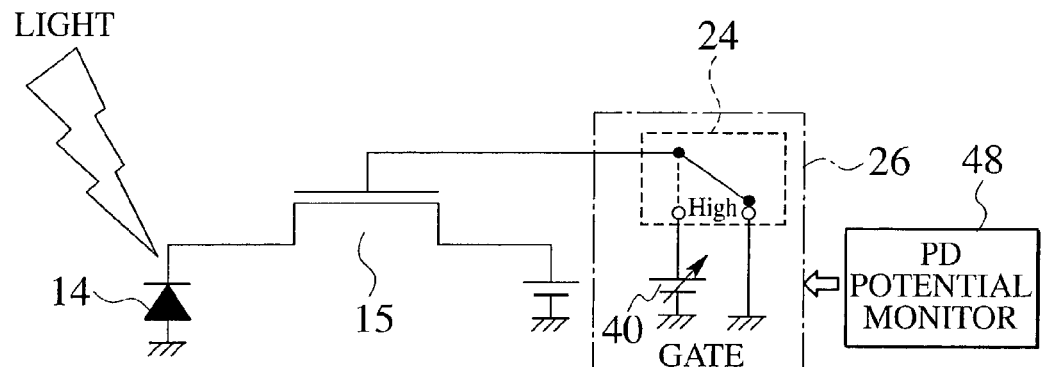
FIG. 9A is a circuit diagram of the unit pixel shown in FIG. 8, which is simplified for describing a readout operation.

FIG. 9A is a circuit diagram in which a part of the configuration of FIG. 8 has been simplified in order to illustrate the operations of the photodiode 14 and the first readout transistor 15 shown in FIG. 8. More specifically, instead of the readout voltage generator 7 and the level shift circuit 4 shown in FIG. 8, the gate voltage generator 26 is equivalently connected to the gate electrode of the first readout transistor 15. Moreover, instead of the reset transistor 16, the row select transistor 17 and the amplifying transistor 18 shown in FIG. 8, the power supply 49 is equivalently connected to the drain electrode of the first readout transistor 15.

As shown in FIG. 9A, the anode terminal of the photodiode 14 is grounded, while the cathode terminal of the photodiode 14 is connected to the source electrode of the first readout transistor 15. A positive voltage is applied to the drain electrode of the first readout transistor 15. The gate voltage generator 26 configured to control the ON/OFF of the first readout transistor 15, is connected to the gate electrode of the first readout transistor 15.

The gate voltage generator 26 includes the select switch 24 having two terminals, i.e., on the Low side and the High side terminals. The Low-side terminal is grounded, whereas the power supply 40 having a varying voltage level is connected to the High-side terminal. When the select switch 24 is turned to the Low-side terminal, the first readout transistor 15 is set to be in an OFF state. On the other hand, when the select switch 24 is turned to the High-side terminal, the first readout transistor 15 is turned to be in an ON state. A voltage level of the power supply 40 is determined based on the first depletion potential of the monitor resistor, which is measured in an approximate manner by the PD potential monitor 48.

Figure 9B:
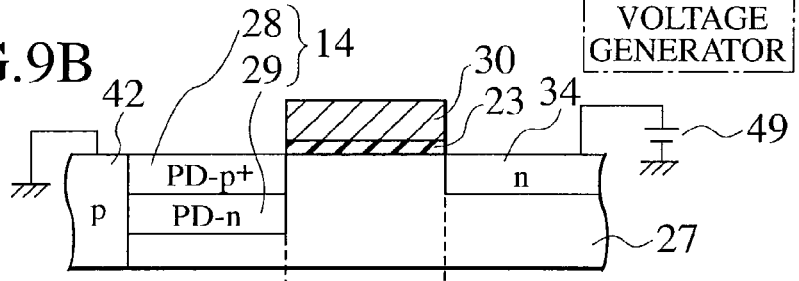
FIG. 9B is a cross-sectional view showing actual device structures of a photodiode and a first readout transistor shown in FIG. 9A.

FIG. 9B shows the arrangement of the photodiode 14 and the first readout transistor 15 shown in FIG. 9A in a real device. The first gate electrode 30 is placed on the p-type silicon substrate 27 through the first gate insulating film 23. The buried photodiode 14 and the n-type drain region 34 are placed in the upper portion of the silicon substrate 27 at both sides of the first gate electrode 30. The photodiode 14 includes the first $p^+$-type PD region 28 placed in an upper portion including a surface of the silicon substrate 27 and the first n-type PD region 29 placed inside the silicon substrate 27 so as to be adjacent to the first $p^+$-type PD region 28. The p-type region 42 is disposed in an upper portion at the surface of the silicon substrate 27 so as to be adjacent to the photodiode 14. The p-type region 42 is grounded.

Figure 10A:
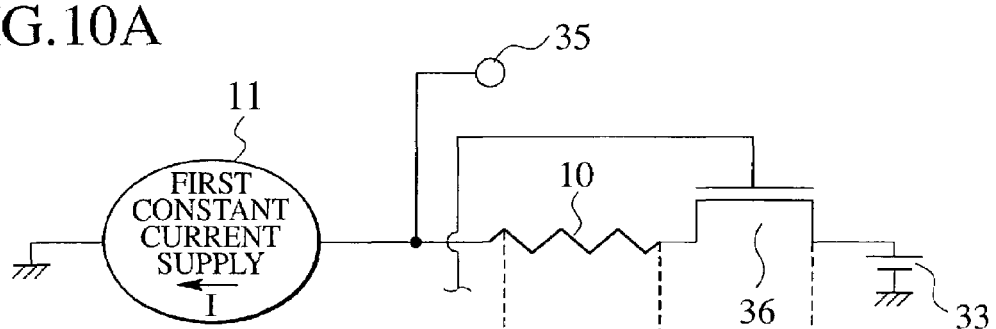
FIG. 10A is a circuit diagram showing the PD potential monitor shown in FIG. 8.

FIG. 10A uniquely shows the PD potential monitor 48 in an extracted manner in order to describe the operation of the PD potential monitor 48 shown in FIG. 8. A monitor terminal 35 configured to monitor the first depletion potential of the monitor resistor 10, is connected between the first constant current supply 11 and the monitor resistor 10.

Figure 10B:
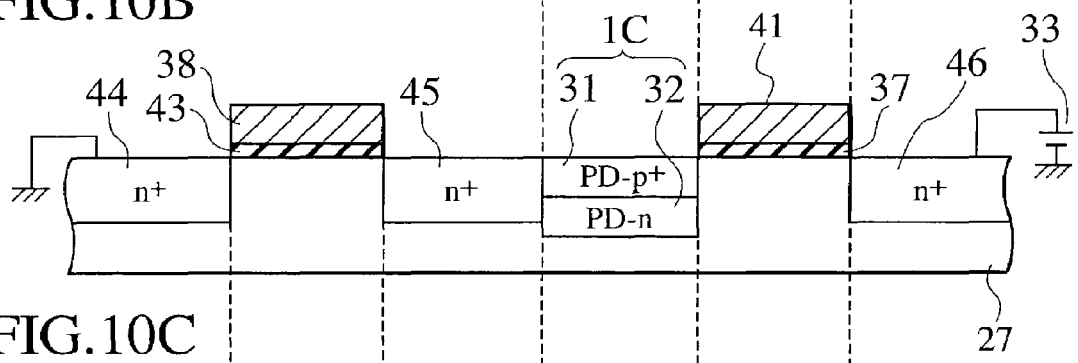
FIG. 10B is a cross-sectional view showing actual device structures of a second readout transistor, a monitor resistor and a first constant current supply shown in FIG. 10A.

FIG. 10B shows a cross-sectional structure of the PD potential monitor 48 shown in FIG. 10A in a real device. As shown in FIG. 10B, an n-type MOS transistor designed so as to operate in a pentode region is used as the first constant current supply 11 shown in FIG. 10A. The n-type MOS transistor includes the second gate electrode 38 placed on the silicon substrate 27 through the second gate insulating film 43, the $n^+$-type source region 44, and the $n^+$-type drain region 45. The $n^+$-type source region 44, and the $n^+$-type drain region 45 are placed in an upper portion of the silicon substrate 27 including a surface thereof at both sides of the second gate electrode 38. The monitor resistor 10 includes the second $p^+$-type PD region 31 placed in an upper portion of the silicon substrate 27 including the surface thereof and the second n-type PD region 32 placed inside the silicon substrate 27 so as to be adjacent to the second $p^+$-type PD region 31. The monitor resistor 10 uses the second n-type PD region 32 as a resistive element. Both of the second $p^+$-type PD region 31 and the second n-type PD region 32 are placed adjacent to the first $n^+$-type drain region 45. The monitor resistor 10 has a similar cross-sectional structure to that of the photodiode 14 shown in FIG. 9B. Impurity concentration distributions of the second $p^+$-type PD region 31 and the second n-type PD region 32 have substantially the same profiles as those of the impurity concentration distributions of the first $p^+$-type PD region 28 and the first n-type PD region 29 shown in FIG. 9B. Therefore, the first depletion potential DP1 of the monitor resistor 10 is substantially identical with the second depletion potential DP2 of the photodiode 14. The second readout transistor 36 includes a third gate electrode 41 placed on the silicon substrate 27 through a third gate insulating film 37 and an $n^+$-type region 46 placed in an upper portion of the silicon substrate 27 including the surface thereof at the side of the third gate electrode 41. The monitor resistor 10 is placed at the side of the third gate electrode 41. A positive voltage is applied to the $n^+$-type region 46.

The photodiodes 14 are placed in each of the plurality of unit pixels $Q_{11}, \ldots, Q_{1m}, \ldots, Q_{n1}, \ldots$ and $Q_{nm}$ arranged in the form of a matrix within the pixel section 2, as shown in FIG. 7. On the other hand, the monitor resistor 10 is formed within the PD potential monitor 48 placed on the peripheral space of the semiconductor chip 1.

Next, an operation of the CMOS image sensor according to the second embodiment of the present invention will be described. As shown in FIG. 8, the reset transistor 16 is turned ON by the reset signal RS from the vertical shift register 3, and the potential of the gate electrode of the amplifying transistor 18 is set to be in an initial state (power supply voltage: Vd). At this moment, the first readout transistor 15 is in an OFF state. Thereafter, the reset transistor 16 is set to be in an OFF state.

When the photodiode 14 is irradiated with light, electron-hole pairs, the number of which is in proportion to the amount of light, are generated due to photoelectric effects. The holes escape from the anode region of the photodiode 14 toward the ground potential, whereas the electrons are accumulated in the cathode region of the photodiode 14. The electrons accumulated in the cathode region correspond to signal charges accumulated in the photodiode 14. Since there is a limit in the amount of charges which the photodiode 14 can accumulate therein, it is necessary to perform an operation for regularly reading out the signal charges from the photodiode 14. The first readout transistor 15 is turned ON by the readout pulse signal RP for reading out the signal charges. Then, the signal charges accumulated in the photodiode 14 pass through the channel of the first readout transistor 15 and are injected to the gate electrode of the amplifying transistor 18. Then, the potential of the gate electrode of the amplifying transistor 18 is dropped from the initial state (Vd) by the amount of the signal charges. When the row select transistor 17 receives the address selection signal AS to be turned ON, the source voltage SV is outputted from the source electrode of the amplifying transistor 18.

Figure 9C:
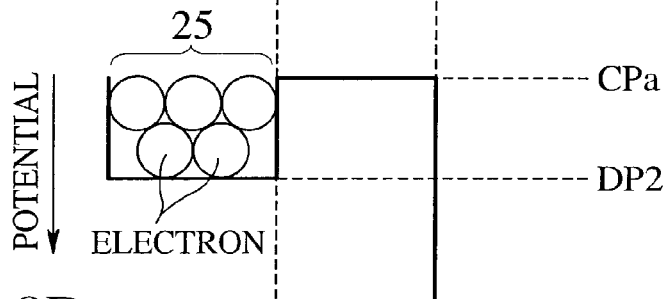
FIG. 9C is a schematic view showing a channel potential of the first readout transistor and a depletion potential of the photodiode when the first readout transistor shown in FIG. 9B is in an OFF state.
Figure 9D:
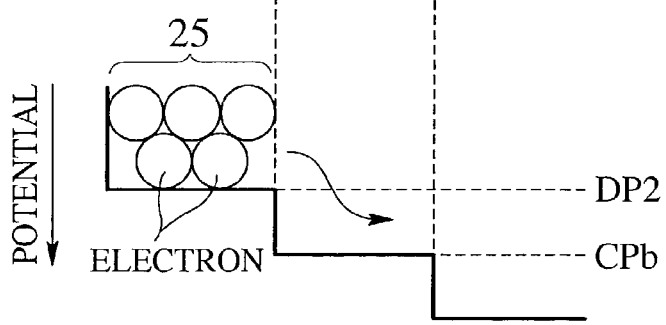
FIG. 9D is a schematic view showing a channel potential of the first readout transistor and a depletion potential of the photodiode when the first readout transistor shown in FIG. 9B is in an ON state.

As shown in FIG. 9C, when the first readout transistor 15 is in an OFF state, a channel potential (Low) CPa decreases immediately below the first gate electrode 30 of the first readout transistor 15. In FIGS. 9C and 9D, the potential is measured in a downward direction. The channel potential (Low) CPa is a potential of the p-type silicon substrate 27 just below the first gate electrode 30 adjacent to the photodiode 14 of the second depletion potential DP2. The p-type region 42 is grounded, and the channel potential (Low) CPa is lower than the second depletion potential DP2. Thus, the potential of the p-type region 42 and the second depletion potential DP2 form a potential barrier with respect to the channel potential (Low) CPa. The signal charges 25 are confined and accumulated within the n-type region 29 of the photodiode 14 by this potential barrier, the potential at the n-type region 29 is set to be the second depletion potential DP2.

As shown in FIG. 9D, when the first readout transistor 15 is in an ON state, the potential of the p-type silicon substrate 27 just below the first gate electrode 30 of the first readout transistor 15 increases to a channel potential (High) CPb. The channel potential (High) CPb is higher than the second depletion potential DP2 of the photodiode 14. More specifically, the second depletion potential DP2 and the channel potential (High) CPb satisfy the relation expressed by the above-mentioned Eq. (1). The voltage level of the power supply 40 shown in FIG. 9A is set so as to satisfy the relation expressed by the Eq. (1).

By always maintaining the relation expressed by the Eq. (1), a small potential barrier as shown in FIG. 1D is prevented from being formed. Therefore, the after-image characteristics of the photodiode 14 are not deteriorated. As described above, however, if the channel potential (High) CPb is set to be excessively high with respect to the second depletion potential DP2, the DC characteristics of the first readout transistor 15 are deteriorated. Therefore, the PD potential monitor 48 indirectly monitors the second depletion potential DP2 of the photodiode 14 so as to feedback the second depletion potential DP2 to the voltage level of the power supply 40.

Figure 10C:
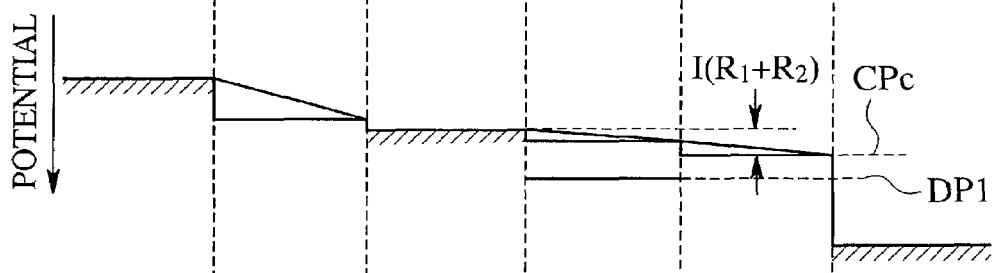
FIGS. 10C and 10D are schematic views showing the respective potentials of the first constant current supply, the monitor resistor and the second readout transistor shown in FIG. 10B.

In FIG. 10C, the second readout transistor 36 is in an ON state, and a channel potential CPc of the second readout transistor 36 is sufficiently lower than the first depletion potential DP1 of the monitor resistor 10. Assuming that a resistance value of the second n-type PD region 32 shown in FIG. 10B is $R_1$, a voltage drop for $IR_1$ occurs in the monitor resistor 10. Moreover, assuming that an on-state resistance of the second readout transistor 36 is $R_2$, a voltage drop for $IR_2$ occurs in the second readout transistor 36. Therefore, a voltage level of the monitor terminal 35 is lower than the channel voltage CPc by $I(R_1+R_2)$.

Figure 10D:
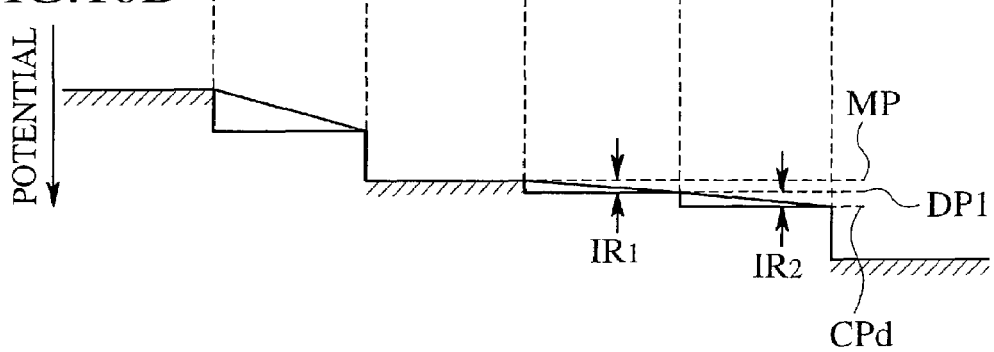

As shown in FIG. 10D, as the gate voltage of the second readout transistor 36 is increased, a channel voltage Cpd correspondingly increases. At the same time, the voltage level appearing at the monitor terminal 35 is also increased. However, the first depletion potential DP1 of the monitor resistor 10 is determined by the impurity concentration distribution and does not vary in accordance with the applied voltage level. Therefore, the voltage level of the monitor resistor 10 never becomes higher than the first depletion potential DP1 shown in FIG. 10D. Correspondingly, the voltage level appearing at the monitor terminal 35 never becomes higher than the monitor potential MP. The "monitor potential MP" is a voltage lower than the first depletion voltage DP1 by $IR_1$.

Thus, the gate voltage of the second readout transistor 36 is varied so as to obtain the maximum value of the voltage level appearing at the monitor terminal 35. The gate voltage of the second readout transistor 36, when the voltage level appearing on the monitor terminal 35 has its maximum value, is outputted. By setting the voltage drop ($IR_2$) due to the on-state resistance $R_2$ of the second readout transistor 36 at a negligibly small value with respect to the first depletion potential DP1, the channel potential CPd can be regarded as the first depletion potential DP1 of the monitor resistor 10. Moreover, by setting a threshold voltage level of the second readout transistor 36 at a negligibly small value with respect to the first depletion potential DP1, the gate voltage of the second readout transistor 36 can be regarded as the channel potential CPd. Accordingly, the PD potential monitor 48 can measure the first depletion potential DP1 of the monitor resistor 10 in an approximate manner, and therefore, can indirectly measure the second depletion potential DP2 of the photodiode 14.

The gate voltage of the second readout transistor 36 is converted into the readout voltage RV by the readout voltage generator 7 shown in FIG. 8. The level shift circuit 4 amplifies the pulse signal PS supplied from the vertical shift register 3 based on the readout voltage RV and generates the readout pulse signal RP. The readout pulse signal RP is selectively applied to the gate electrode of the first readout transistor 15 in each of the unit pixels $Q_{11}, \ldots, Q_{1m}, \ldots, Q_{n1}, \ldots$ and $Q_{nm}$ via the readout signal line 21.

As described above, the PD potential monitor 48 can indirectly monitor the first depletion potential DP1 of the photodiode 14 for each semiconductor chip by monitoring the gate voltage of the second readout transistor 36. Then, a voltage level, which allows the relation expressed by the Eq. (1) to be maintained and does not deteriorate the DC characteristics of the first readout transistor 15, is applied to the first gate electrode 30 of the first readout transistor 15 to read out the signal charges. More specifically, the minimum voltage level, which does not cause the deterioration of the after-image characteristics, is applied to the first gate electrode 30 of the first readout transistor 15. Therefore, it is possible to provide a CMOS image sensor without any deterioration in the after-image characteristics while minimizing the occurrence of DC failures.

It is sufficient to apply a relatively high readout voltage to the gate electrode only for a CMOS image sensor including a photodiode having relatively high depletion potential, that is, having relatively poor after-image characteristics. Therefore, it is possible to provide a CMOS image sensor without any deterioration in the after-image characteristics while decreasing the probability of the occurrence of DC failures.

It is desirable to set the on-state resistance $R_2$ to be relatively small by appropriately designing a width (W) and a length (L) of the channel of the second readout transistor 36. For example, a desirable setting of $R_2$ is approximately the range of about 5 to 500 kΩ. Moreover, the monitor potential MP of the monitor terminal 35 is lower than the channel potential CPd by $I(R_1+R_2)$. Therefore, it is desirable to design the actual circuit so as to satisfy the relation of $10\times I(R_1+R_2)<Vd$.

Next, an example of a fabrication method of the unit pixel $Q_{11}$ shown in FIG. 9B and the PD potential monitor 48 shown in FIG. 10B will be described with reference to FIGS. 11A to 11E.

Figure 11A:
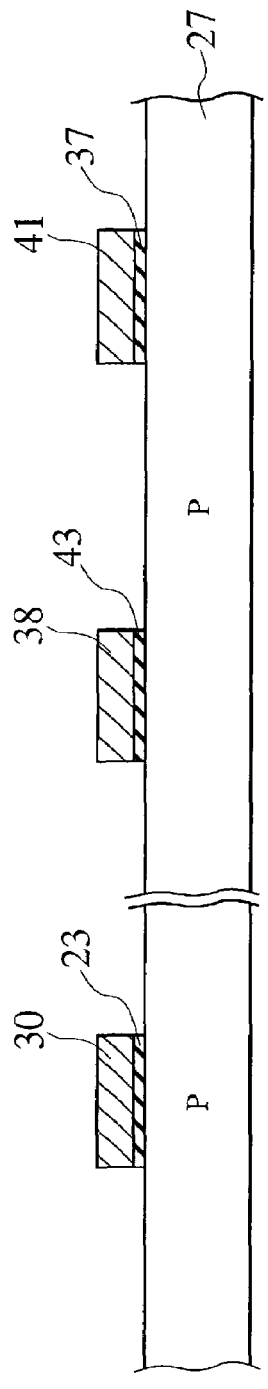
FIGS. 11A to 11E are cross-sectional diagrams showing a fabrication process of the unit pixel shown in FIG. 9B and the PD potential monitor shown in FIG. 10B.

(1) First, a gate insulating film and a gate electrode film are sequentially deposited on the silicon substrate 27 using a chemical vapor deposition (CVD) method. Part of the gate insulating film and the gate electrode film are selectively removed using a photolithography method and an anisotropic etching method. As a result, as shown in FIG. 11A, the first gate insulating film 23, the second gate insulating film 43, the third gate insulating film 37, the first gate electrode 30, the second gate electrode 38 and the third gate electrode 41 are simultaneously produced on the silicon substrate 27.

Figure 11B:
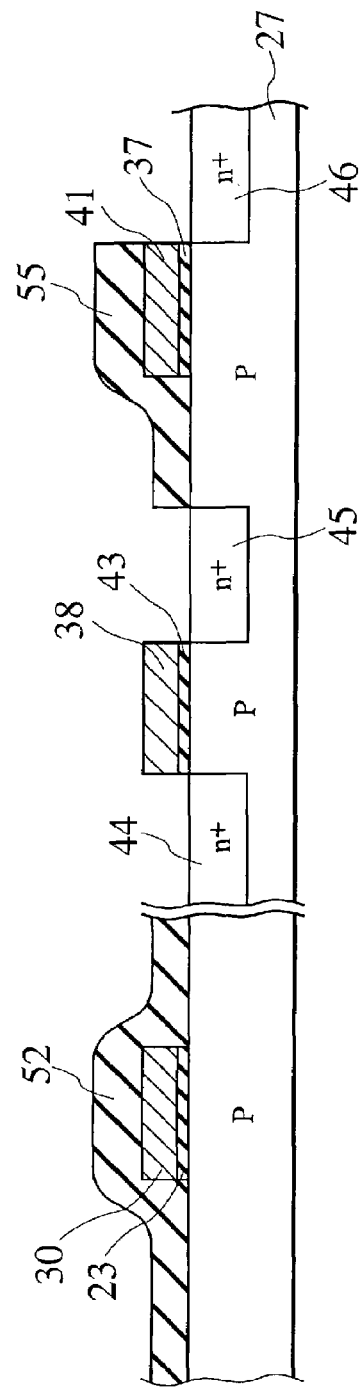

(2) A first mask 55 having openings in the regions where the $n^+$-type source region 44, the $n^+$-type drain region 45 and the $n^+$-type region 46 are to be produced, is formed by the photolithography method and the anisotropic etching method. N-type impurity ions are selectively implanted into the silicon substrate 27 through the openings in the first mask 55 by ion implantation. A thermal treatment is conducted to produce the $n^+$-type source region 44, the $n^+$-type drain region 45 and the $n^+$-type region 46, as shown in FIG. 11B.

Figure 11C:
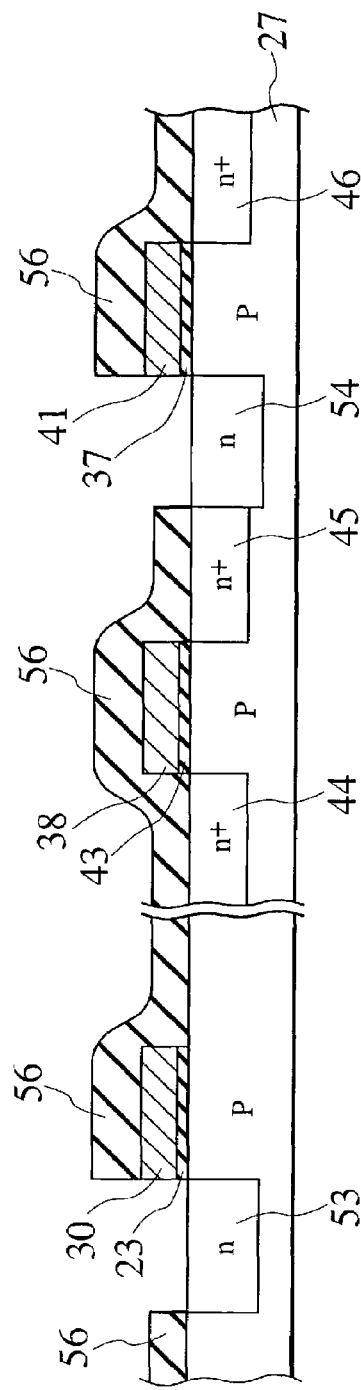

(3) After removal of the first mask 55, a second mask 56 having openings in the regions where the photodiode 14 and the monitor resistor 10 are to be produced, is formed using the photolithography method and the anisotropic etching method. N-type impurity ions are selectively implanted into the silicon substrate 27 through the openings in the second mask 52 by ion implantation. A thermal treatment is conducted to produce the first n-type region 53 and the second n-type region 54, as shown in FIG. 11C.

Figure 11D:
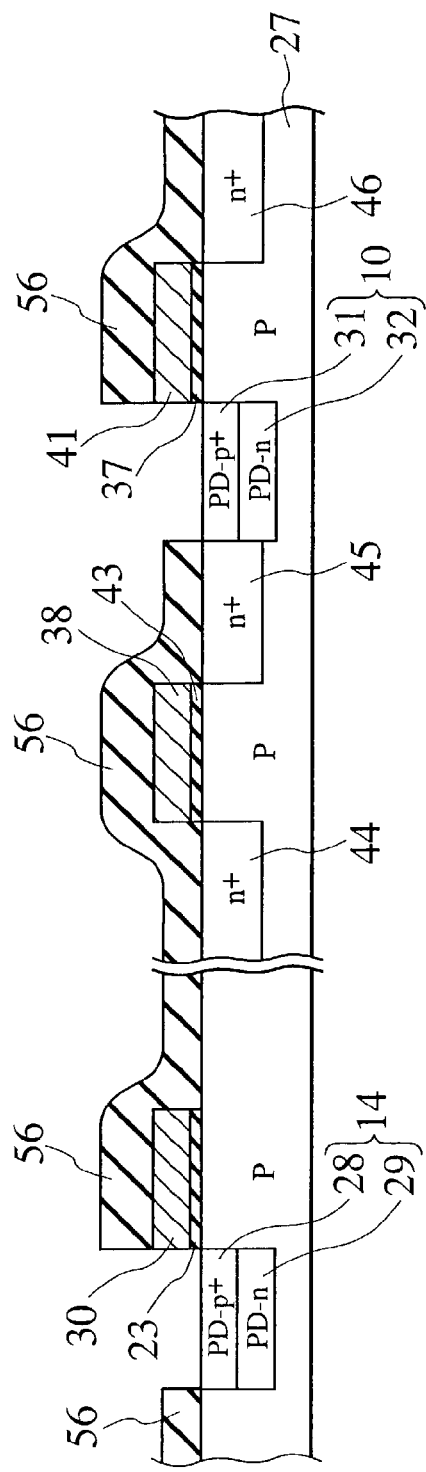

(4) P-type impurity ions are selectively implanted into the silicon substrate 27 through the openings in the second mask 56 by ion implantation. The p-type impurity ions are shallowly implanted as compared with the first and second n-type regions 53 and 54. A thermal treatment is conducted to produce the first $p^+$-type PD region 28 and the second $p^+$-type PD region 31 in the regions where the p-type impurity ions are implanted, as shown in FIG. 11D. The first n-type region 53 and the second n-type region 54, into which the p-type impurity ions are not doped, become the first n-type PD region 29 and the second n-type PD region 32, respectively.

Figure 11E:
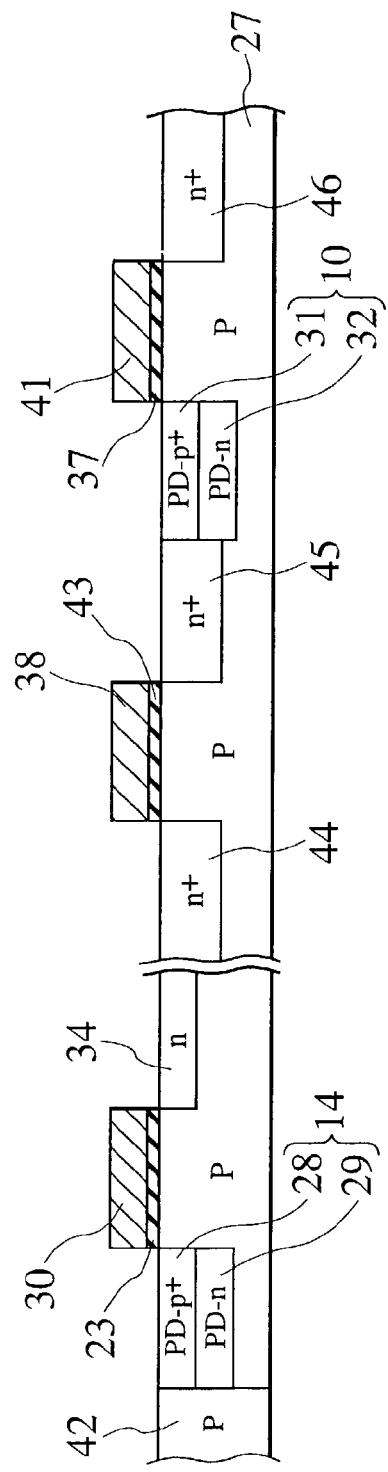

(5) Finally, as shown in FIG. 11E, the n-type drain region 34 is formed using the photolithography method, the anisotropic etching method, and the ion implantation. In a similar manner, the p-type region 42 is formed. Since high dope of the p-type impurity is doped to the p-type silicon substrate 27, the p-type region 42 has a higher p-type impurity concentration than that of the original p-type silicon substrate 27. Through the above-described processes, the photodiode 14 and the first readout transistor 15 shown in FIG. 9B, and the monitor resistor 10, the first constant current supply 11 and the second readout transistor 36 shown in FIG. 10B can be simultaneously processed on the same silicon substrate 27.

As described above, the photodiode 14 and the monitor resistor 10 can be fabricated in the same fabrication processes so that the monitor resistor 10 shown in FIG. 10B has a similar element structure to that of the photodiode 14 shown in FIG. 9B. Thus, the second depletion potential DP2 of the photodiode 14 is substantially identical to the first depletion potential DP1 of the monitor resistor 10.

The process stage forming the first to third n-type regions 44 to 46, the process stage forming the photodiode 14 and the monitor resistor 10, the process stage forming the n-type region 34, and the process stage forming the p-type region 42 can be conducted in any order. The above-described order of implementation is merely an example, and therefore, the order of the process stages may be changed for implementation.

According to the second embodiment of the present invention, a solid state imaging apparatus having a high DC yield and reduced variation in after-image characteristics of the photodiode can be provided.

Other Embodiments

Although the two-dimensional CMOS image sensors have been described as solid state imaging apparatuses in the first and second embodiments by way of example, the present invention is not limited thereto. The present invention is also applicable to a one-dimensional CMOS image sensor (line sensor). Although the case where the MOS transistor operating in a pentode region is used as a constant current supply has been described, the constant current supply is not limited thereto. Furthermore, the circuit configuration of each of the unit pixels $Q_{11}$, $Q_{12}$, ... $Q_{1m}$, ..., $Q_{n1}$, ... and $Q_{nm}$ is not limited to the configuration shown in FIG. 3 or FIG. 8.

As shown in FIG. 12, a line sensor according to another embodiment includes a pixel section 102 having the plurality of unit pixels $Q_{11}$, $Q_{12}$, ... and $Q_{1m}$ arranged linearly, the level shift circuit 4 connected to the pixel section 102, the horizontal shift register 5 connected to the level shift circuit 4, the timing generator 6 connected to the horizontal shift register 5, the readout voltage generator 7 connected to the level shift circuit 4, and the PD potential monitor 8 connected to the readout voltage generator 7.

The horizontal shift register 5 horizontally scans a readout signal for reading out the signal charges held in each of the unit pixels $Q_{11}$, $Q_{12}$, ... and $Q_{1m}$. The timing generator 6 determines the operation timing of the horizontal shift register 5. The PD potential monitor 8 measures in an approximate manner the first depletion potential of the monitor resistor having a similar element structure to that of the photodiode included in each of the unit pixels $Q_{11}$, $Q_{12}$, ... and $Q_{1m}$. The readout voltage generator 7 supplies a readout voltage, which is adjusted based on the result of measurement by the PD potential monitor 8, to the level shift circuit 4. The "readout voltage" serves to read out the signal charges accumulated in the photodiode within each of the unit pixels $Q_{11}$, $Q_{12}$, ... and $Q_{1m}$. The level shift circuit 4 amplifies the readout signal to the readout voltage. The plurality of photodiodes are linearly arranged within the pixel section 102 of the line sensor. On the other hand, the monitor resistor is formed within the PD potential monitor 8 placed on the edge of a semiconductor chip 101. Also in the line sensor, the PD potential monitor 8 may be replaced by the PD potential monitor 48 shown in FIG. 8.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid state imaging apparatus comprising:
   a plurality of unit pixels, each pixel including:
      a photodiode; and
      a first readout transistor connected to the photodiode;
   a monitor including a monitor resistor having the same impurity concentration distribution as that of the photodiode, configured to measure a depletion potential of the monitor resistor; and
   a readout voltage generator configured to generate a readout voltage to be applied to a first control electrode of the first readout transistor based on the depletion potential.

2. The solid state imaging apparatus of claim 1, wherein the readout voltage is applied to the first control electrode to read out signal charges accumulated in the photodiode.

3. The solid state imaging apparatus of claim 2, wherein the monitor further includes a constant current supply connected to one terminal of the monitor resistor, and a positive voltage is applied to the other terminal of the monitor resistor.

4. The solid state imaging apparatus of claim 3, wherein the monitor outputs a potential at the one terminal of the monitor resistor as the depletion potential.

5. The solid state imaging apparatus of claim 3, wherein the monitor further includes a second readout transistor connected to the other terminal of the monitor resistor.

6. The solid state imaging apparatus of claim 5, wherein the monitor outputs, as the depletion potential, a potential of a second control electrode of the second readout transistor when a potential between the constant current supply and the monitor resistor is lower than the depletion potential by a voltage drop due to the monitor resistor.

7. The solid state imaging apparatus of claim 3, wherein the constant current supply is a MOS transistor configured to operate in a pentode region.

8. The solid state imaging apparatus of claim 2, further comprising:
   a pixel section having the unit pixels arranged in the form of a matrix;
   a horizontal shift register connected to the pixel section, the horizontal shift register horizontally scanning a readout signal of the signal charges;
   a level shift circuit connected to the pixel section and the readout voltage generator; and
   a vertical shift register connected to the level shift circuit, the vertical shift register vertically scanning the readout signal.

9. The solid state imaging apparatus of claim 2, further comprising:
   a pixel section having the unit pixels arranged linearly;
   a level shift circuit connected to the pixel section and the readout voltage generator; and
   a horizontal shift register connected to the level shift circuit, the horizontal shift register horizontally scanning a readout signal of the signal charges.

10. The solid state imaging apparatus of claim 1, wherein the photodiode includes a first p-type semiconductor region and a first n-type semiconductor region placed adjacent to the first p-type semiconductor region, and the monitor resistor includes a second p-type region and a second n-type region placed adjacent to the second p-type semiconductor region, the second p-type region having the same impurity concentration distribution as that of the first p-type semiconductor region, the second n-type region having the same impurity concentration distribution as that of the first n-type semiconductor region.

11. A solid state imaging apparatus comprising:
   a plurality of unit pixels, each pixel including:
      a photodiode; and
      a first readout transistor connected to the photodiode;
   a monitor including a monitor resistor having the same depletion potential as that of the photodiode, configured to measure a depletion potential of the monitor resistor; and
   a readout voltage generator configured to generate a readout voltage to be applied to a first control electrode of the first readout transistor based on the depletion potential.

12. The solid state imaging apparatus of claim 11, wherein the readout voltage is applied to the first control electrode to read out signal charges accumulated in the photodiode.

13. The solid state imaging apparatus of claim 12, wherein the monitor further includes a constant current supply connected to one terminal of the monitor resistor, and a positive voltage is applied to the other terminal of the monitor resistor.

14. The solid state imaging apparatus of claim 13, wherein the monitor outputs a potential at the one terminal of the monitor resistor as the depletion potential.

15. The solid state imaging apparatus of claim 13, wherein the monitor further includes a second readout transistor connected to the other terminal of the monitor resistor.

16. The solid state imaging apparatus of claim 15, wherein the monitor outputs, as the depletion potential, a potential of a second control electrode of the second readout transistor when a potential between the constant current supply and the monitor resistor is lower than the depletion potential by a voltage drop due to the monitor resistor.

17. The solid state imaging apparatus of claim 13, wherein the constant current supply is a MOS transistor configured to operate in a pentode region.

18. The solid state imaging apparatus of claim 12, further comprising:
   a pixel section having the unit pixels arranged in the form of a matrix;
   a horizontal shift register connected to the pixel section, the horizontal shift register horizontally scanning a readout signal of the signal charges;
   a level shift circuit connected to the pixel section and the readout voltage generator; and
   a vertical shift register connected to the level shift circuit, the vertical shift register vertically scanning the readout signal.

19. The solid state imaging apparatus of claim 12, further comprising:
   a pixel section having the unit pixels arranged linearly;
   a level shift circuit connected to the pixel section and the readout voltage generator; and a horizontal shift register connected to the level shift circuit, the horizontal shift register horizontally scanning a readout signal of the signal charges.

20. The solid state imaging apparatus of claim 11, wherein the photodiode includes a first p-type semiconductor region and a first n-type semiconductor region placed adjacent to the first p-type semiconductor region, and the monitor resistor includes a second p-type region and a second n-type region placed adjacent to the second p-type semiconductor region, the second p-type region having the same impurity concentration distribution as that of the first p-type semiconductor region, the second n-type region having the same impurity concentration distribution as that of the first n-type semiconductor region.

* * * * *